(12) United States Patent
Schrape et al.

(10) Patent No.: US 11,527,271 B2
(45) Date of Patent: Dec. 13, 2022

(54) SELF-CORRECTING MODULAR-REDUNDANCY-MEMORY DEVICE

(71) Applicant: IHP GmbH—Innovations for High Performance Microelectronics / Leibniz-Institut für innovative Mikroelektronik, Frankfrust (DE)

(72) Inventors: Oliver Schrape, Frankfurt (DE); Anselm Breitenreiter, Frankfurt (DE); Frank Vater, Frankfurt (DE); Milos Krstic, Frankfurt (DE)

(73) Assignee: IHP GMBH—Innovations for High Performance Microelectronics / Leibniz-Institut für innovative Mikroelektronik, Frankfurt (DE)

( * ) Notice: Subject to any disclaimer, the term of this patent is extended or adjusted under 35 U.S.C. 154(b) by 0 days.

(21) Appl. No.: 17/466,015

(22) Filed: Sep. 3, 2021

(65) Prior Publication Data
US 2022/0076718 A1 Mar. 10, 2022

(30) Foreign Application Priority Data
Sep. 4, 2020 (EP) .................................... 20194694

(51) Int. Cl.
*G11C 7/10* (2006.01)
*G11C 7/22* (2006.01)
(Continued)

(52) U.S. Cl.
CPC ............ *G11C 7/1063* (2013.01); *G11C 7/106* (2013.01); *G11C 7/109* (2013.01); *G11C 7/1087* (2013.01);
(Continued)

(58) Field of Classification Search
CPC ..... G11C 7/1063; G11C 7/106; G11C 7/1087; G11C 7/109; G11C 7/222; H03K 5/135;
(Continued)

(56) References Cited

U.S. PATENT DOCUMENTS

| 8,975,913 B2 | 3/2015 | Smith |
| 2010/0322023 A1 | 12/2010 | Matsuo |
| 2018/0046580 A1* | 2/2018 | Clark .................. G06F 11/1474 |

FOREIGN PATENT DOCUMENTS

| DE | 3840493 C1 * | 1/1990 | |
| DE | 102005030142 B3 * | 12/2006 | ......... G11C 13/0004 |
| EP | 3490149 | 5/2019 | |

OTHER PUBLICATIONS

Extended Search Report for European Patent Application No. 20194694.4, dated Feb. 16, 2021, 8 pages.
(Continued)

*Primary Examiner* — Fernando Hidalgo
(74) *Attorney, Agent, or Firm* — Sheridan Ross P.C.

(57) ABSTRACT

The invention is directed to a self-correcting modular-redundancy-memory device, comprising three bistable-memory elements and a majority voter. The bistable-memory elements receive respective binary data signal, clock signal, and a feedback signal. Each of the bistable-memory elements is configured, in response to the clock signal assuming a first value, to provide a binary output signal with an output-signal value correlated to a data-signal value of the data signal, and in response to the clock signal assuming a second clock-signal value, to provide the output signal with the output-signal value indicative of a current feedback-signal value of the feedback signal. The majority voter receives the output signals each of the bistable-memory elements and is configured to provide the feedback signal with the feedback-signal value indicative of that
(Continued)

output-signal value taken on by a majority of the currently received output signals.

13 Claims, 18 Drawing Sheets

(51) Int. Cl.
*H03K 5/135* (2006.01)
*H03K 5/15* (2006.01)
(52) U.S. Cl.
CPC ............. *G11C 7/222* (2013.01); *H03K 5/135* (2013.01); *H03K 5/15066* (2013.01)
(58) Field of Classification Search
CPC . H03K 5/15066; H03K 3/013; H03K 19/0033
USPC .................................................. 365/189.05
See application file for complete search history.

(56) References Cited

OTHER PUBLICATIONS

Hindman et al. "Fully Automated, Testable Design of Fine-Grained Triple Mode Redundant Logic," IEEE Transactions on Nuclear Science, Dec. 2011, vol. 58, No. 6, pp. 3046-3052.
Ramamurthy et al. "Muller C-element Self-corrected Triple Modular Redundant Logic with Multithreading and Low Power Modes," IEEE, 2017 17th European Conference on Radiation and Its Effects on Components and Systems (RADECS), Oct. 2-6, 2017, 4 pages.
Rezgui et al. "New Methodologies for SET Characterization and Mitigation in Flash-Based FPGAs," IEEE Transactions on Nuclear Science, Dec. 2007, vol. 54, No. 6, 10 pages.

* cited by examiner

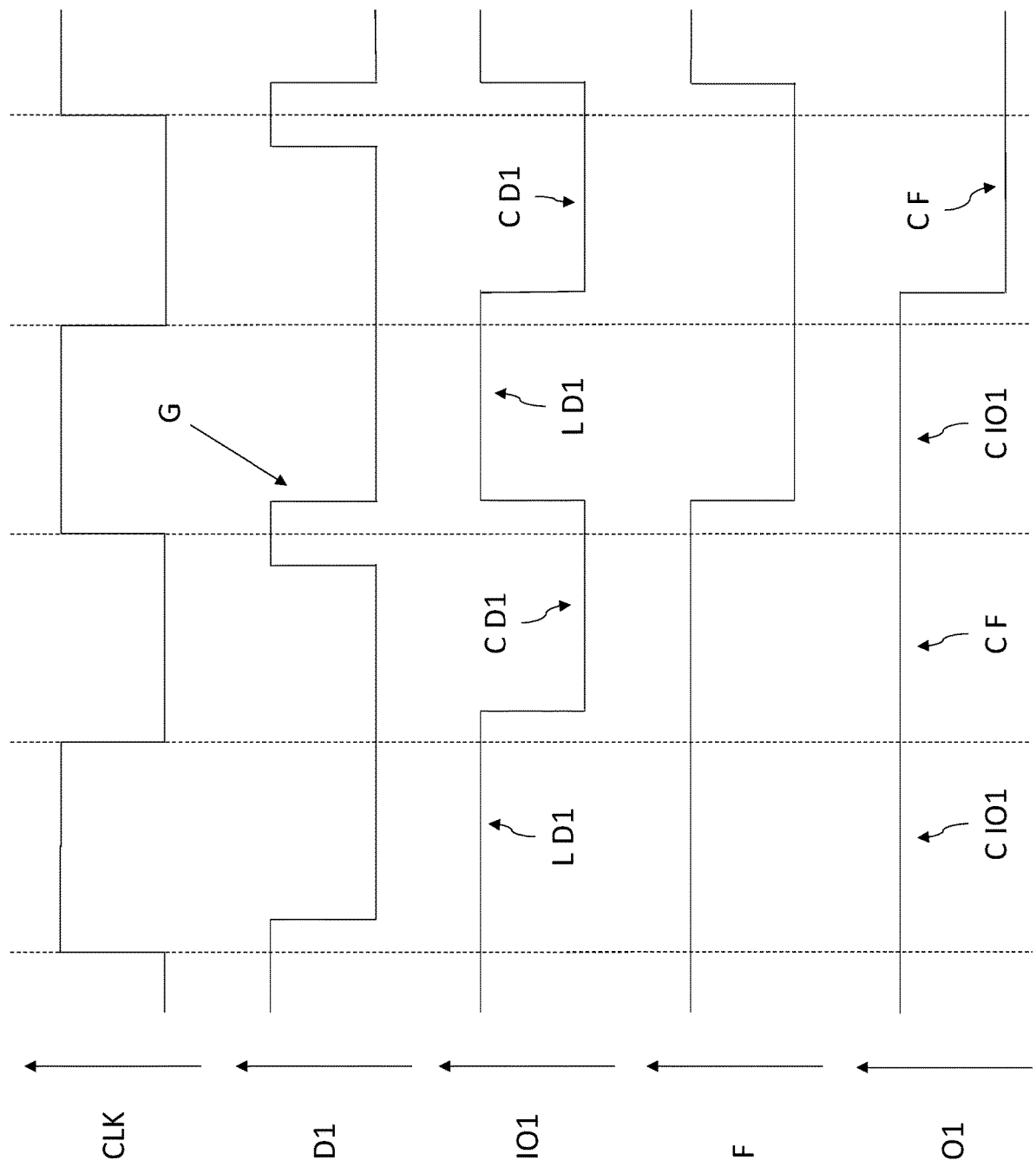

SELF-CORRECTING MODULAR-REDUNDANCY-MEMORY DEVICE

CROSS-REFERENCE TO RELATED APPLICATION

This application claims the benefit of European Patent Application No. 20194694.4 filed Sep. 4, 2020, the entire contents of which are incorporated herein by reference in its entirety.

FIELD

The present invention relates to a self-correcting modular-redundancy-memory device.

BACKGROUND

Electronic systems that are used in environments in which the electronic circuits are exposed to radiation require integrated correction mechanisms. The publication N. D. Hindman, L. T. Clark, D. W. Patterson, and K. E. Holbert, "Fully automated testable design of fine-grained triple mode redundant logic," Nucl. Sci., vol. 58, no. 6, pp. 3046-3052, October 2011, hereinafter referred to as Hindman et al., discloses a voting feedback circuit for triple modular redundant (TMR) self-correcting flip-flops comprising three flip-flops. Each of the flip-flops comprises a master latch and a slave latch, wherein the feedback loop of the slave latch of each of the flop-flops comprises a majority gate driven by the other redundant copies of the flop-flip.

SUMMARY

A self-correcting modular-redundancy-memory device in accordance with the present invention is defined in claim 1.

Accordingly, a self-correcting modular-redundancy-memory device is described, which comprises an odd number of at least three bistable-memory elements and a majority voter.

The bistable-memory elements receive each a respective binary data signal, a respective binary clock signal, and a respective binary feedback-signal. Each of the bistable-memory elements is configured to in response to the binary clock signal assuming a first clock-signal value, provide a binary output signal with an output-signal value correlated to a data-signal value of the data signal, and in response to the binary clock signal assuming a second clock-signal value, provide the output signal with the output-signal value indicative of a current feedback-signal value of the feed-back signal.

Furthermore, the majority voter receives the output signal of each of the bistable-memory elements and is configured to provide the feedback signal with the feedback-signal value indicative of that output-signal value taken on by a majority of the currently received output signals.

The self-correcting modular-redundancy-memory device of the present invention is based on the recognition that redundancy of bistable-memory elements in combination with a majority voter in the feedback path of the bistable-memory elements increases a robustness of stored information against radiation. The redundancy of the memory elements is particularly advantageous against Single Event Upsets (SEUs), wherein a value stored in one of the memory elements is changed due to a direct particle strike. The self-correction is particularly advantageous for those electronic circuits in which data is left unchanged for an extended amount of time, e.g. in electronic circuits that use a gated clock. In those electronic circuits, multiple SEUs occurring over the extended period of time can affect a majority of the redundant memory elements such that redundancy itself is not sufficient to protect the memory elements against SEUs.

The self-correcting modular-redundancy-memory device achieves a simplification and reduction in size in comparison with known devices by having a single majority voter in the feedback path of all bistable-memory elements, wherein the feedback signal of the majority voter is fed back to each of the bistable-memory elements to close the feedback path.

The binary data signal, the binary clock signal, and the binary feedback signal each holds one of two possible values at any moment in time. Hereinafter, those values are referred to as HIGH or "1" and LOW or "0". Moreover, the first clock-signal value is either defined as HIGH or as LOW, wherein the second clock-signal value is defined as the opposite value.

In the following, preferred embodiments of the self-correcting modular-redundancy-memory device will be described.

In one embodiment of the self-correcting modular-redundancy-memory device, each bistable-memory element additionally receives a SET-signal. Moreover, the bistable-memory element is configured to, if indicated by a SET-signal value of the SET-signal, provide the binary output signal with the output-signal value set to HIGH independently of the data-signal value of the data signal and the clock-signal value of the clock signal. In another embodiment of the self-correcting modular-redundancy-memory device, the bistable-memory element additionally or alternatively receives a RESET-signal and the bistable-memory element is configured to, if indicated by the RESET-signal, provide the output signal with the output-signal value set to LOW independently of the data-signal value of the data signal and the clock-signal value of the clock signal.

In yet another embodiment of the self-correcting modular-redundancy-memory device, the bistable-memory elements receive the binary data signal or the binary clock signal in parallel. In an alternative embodiment, the bistable-memory elements each receive a different binary data signal or binary clock signal, wherein the different binary data signals or binary clock signals are indicative of a common binary data signal and a binary clock signal, respectively.

In a preferred embodiment, the self-correcting modular-redundancy-memory device further comprises a feedback-SET-filter unit that receives, as a filter-input signal, the feedback signal. The single-event-transient filter unit is configured to provide, as a filter-output signal, to at least one of the bistable-memory elements a filtered feedback signal, which corresponds to the received feedback signal from which at least a part of signal disturbances caused by single-event transients is removed. This embodiment is particularly advantageous, for removing glitches causes by single-event transients from the feedback signal. The word remove in this regard also comprises a delay of the feedback signal, such that a glitch caused by a single-event transient lies outside of a time window where it affects the at least one bistable-memory element.

In yet another preferred embodiment, the self-correcting modular-redundancy-memory device further comprises a data-SET-filter unit that receives, as a filter-input signal, one data signal and is configured to provide, as a filter-output signal, to at least one of the bistable-memory elements a filtered data signal, which corresponds to the received data signal from which at least a part of signal disturbances caused by single-event transients is removed. This embodiment is particularly advantageous, for removing glitches caused by single-event transients from the data signal. The word remove in this regard also comprises a delay of the data signal, such that a glitch caused by a single-event transient lies outside of a time window where it affects the at least one bistable-memory element.

In another preferred embodiment, the self-correcting modular-redundancy-memory device further comprises a clock-SET-filter unit that receives, as a filter-input signal, the clock signal and is configured to provide, as a filter-output signal, to at least one of the bistable-memory elements a filtered clock signal, which corresponds to the received clock signal from which at least a part of signal disturbances caused by single-event transients is removed. This embodiment is particularly advantageous, for removing glitches caused by single-event transients from the clock signal. The word remove in this regard also comprises a delay of the clock signal, such that a glitch caused by a single-event transient lies outside of a time window where it affects the at least one bistable-memory element.

In variants of embodiments comprising the feedback-SET-filter unit or the data-SET-filter unit or the clock-SET-filter unit comprise
  at least one delay unit which receives the filter-input signal and is configured to provide, as the filtered-output signal, the filter-input signal delayed by a predetermined time-span, or
  at least one guard gate that receives the filter-input signal and a filter-input signal delayed by a predetermined time span and is configured to provide, as the filter-output signal, a signal that is correlated to the filter-input signal and the delayed filter-input signal.

The use of delay units is particularly advantageous to shift the filter-input signal in time such that any glitches caused by single-event transients are shifted outside of a time window where they do not affect the bistable-memory elements. The use of the guard gate receiving a signal and a time-delayed copy of the signal is particularly advantageous for removing from the signal glitches of short duration, such as those caused by single-event transients. The delay unit and the guard gate can be present at the same time.

In a further embodiment, each of the bistable-memory elements comprised within the self-correcting modular-redundancy-memory device is configured to, in response to the binary clock signal assuming the first clock-signal value, provide the binary output signal with the output-signal value indicative of that data-signal value assumed by the data signal during a last preceding transition of the clock-signal value from the second clock-signal value to the first clock-signal value. This embodiment is particularly advantageous, because functioning of each of the bistable-memory elements corresponds to that of a self-correcting flip-flop.

In a variant of this embodiment, each of the bistable-memory elements comprises a latch and an open-latch.

The latch receives the data signal and the clock signal and is configured to
  in response to the binary clock signal assuming the second clock-signal value, provide an intermediate-output signal with an intermediate-output-signal value indicative of the current data-signal value of the data signal, and
  in response to the binary clock signal assuming the first clock-signal value, provide the intermediate-output signal with the intermediate-output-signal value indicative of that data-signal value assumed by the data signal when the clock signal last assumed the second clock-signal value.

Moreover, the open-latch receives the intermediate-output signal, the feedback signal, and the clock signal and is configured to
  in response to the binary clock signal assuming the first clock-signal value, provide the output signal with the output-signal value indicative of the current intermediate-output-signal value of the intermediate-output signal, and
  in response to the binary clock signal assuming the second clock-signal value, provide the output signal with the output-signal value indicative of the current feedback-signal value of the feed-back signal.

In this embodiment, the latch corresponds to a regular latch known from the prior art. The open-latch, on the other hand, corresponds to a latch whose feedback path is opened to include the majority voter into the feedback path. This embodiment is particularly advantageous, because the bistable-memory elements function as self-correcting flip-flops. Moreover, by including the majority voter into the feedback path of the open-latch, a reduction in size and complexity of the integrated circuit is enabled.

In another embodiment of the self-correcting modular-redundancy-memory device, each of the bistable-memory elements is configured to, in response to the binary clock signal assuming a first clock-signal value, provide a binary output signal with an output-signal value indicative of a current data-signal value of the data signal. This embodiment is particularly advantageous, because the functioning of each of the bistable-memory elements corresponds to that of a self-correcting latch.

In a variant of this embodiment, each of the bistable-memory elements comprises an open-latch. The open-latch receives the data signal, the clock signal, and the feedback signal. Furthermore, the open-latch is configured to
  in response to the binary clock signal assuming the first clock-signal value, provide the output signal with the output-signal value indicative of the current data-signal value of the data signal, and
  in response to the binary clock signal assuming the second clock-signal value, provide the output signal with the output-signal value indicative of the current feedback-signal value of the feedback signal. This embodiment is particularly advantageous, because the functioning of each of the open-latches corresponds to that of a self-correcting flip-flop.

In a variant of those embodiments of the self-correcting modular-redundancy-memory device that comprise open-latches, each of the open-latches comprises a data-forwarding circuit. The data-forwarding circuit receives the clock signal and either, in the case that the bistable-memory element only comprises an open-latch, the data signal or, in the case that the bistable-memory element comprises a latch and an open-latch, the intermediate-output signal, both hereinafter identically referred to as logic signal. Moreover, the data-forwarding circuit is configured to, in response to the binary clock signal assuming the first clock-signal value, provide the output signal with the output-signal value indicative of a current logic-signal value of the logic signal to the majority voter. Furthermore, the data-forwarding circuit is configured, in response to the binary clock signal assuming the second clock-signal value, prevent the provision of the output signal by the data-forwarding circuit. This embodiment is particularly advantageous, because the data-forwarding circuit provides an efficient realization of a part of the functionality of the open-latch.

In yet another variant of those embodiments of the self-correcting modular-redundancy-memory device that comprise open-latches, each of the open-latches comprises a feedback-forwarding circuit. The feedback-forwarding circuit receives the feedback signal and the clock signal. Moreover, the feedback-forwarding circuit is configured to, in response to the binary clock signal assuming the second clock-signal value, provide the output signal with the output-signal value indicative of the current feedback-signal value of the feedback signal to the majority voter. Furthermore, the feedback-forwarding circuit is configured to, in response to the binary clock signal assuming the first clock-signal value, prevent the provision of the output signal by the feedback-forwarding circuit. This embodiment is particularly advantageous, because the feedback-forwarding circuit provides an efficient realization of a part of the functionality of the open-latch.

In variants of the self-correcting modular-redundancy-memory device that comprise a feedback-relay device or a data-relay device, the data-forwarding circuit or the feedback-forwarding circuit comprise a tristate inverter or a combination of a transmission gate and a C-element. The embodiment is particularly advantageous, because tristate inverters or a combination of a transmission gate and a C-element allow an efficient realization of a feedback-forwarding circuit and a data-forwarding circuit.

In yet another embodiment of the self-correcting modular-redundancy-memory device, the number of bistable-memory elements is three. This embodiment is particularly advantageous, because three bistable-memory elements form the minimal amount of redundant data storage elements that allow a majority voting. Therefore, this embodiment is particularly cost and space efficient.

In a further embodiment, the self-correcting modular-redundancy-memory device comprises an output interface for externally providing the feedback signal. The feedback signal corresponds to the data stored in the redundant bistable-memory elements corrected by the majority voter. Therefore, this embodiment is particularly advantageous, because it provides the means to provide the corrected output of the bistable-memory elements for further external processing.

In another embodiment, each of the bistable-memory elements is configured to receive a same clock signal. In an alternative embodiment, each of the bistable-memory elements is configured to receive a respective clock-signal that is phase-shifted with respect to the other clock signals received by the remaining bistable-memory elements.

It shall be understood that a preferred embodiment of the present invention can also be any combination of the dependent claims or above embodiments with the respective independent claim.

These and other aspects of the invention will be apparent from and elucidated with reference to the embodiments described hereinafter.

BRIEF DESCRIPTION OF THE DRAWINGS

Further embodiments will be described in the following with reference to the enclosed drawings. In the drawings:

FIG. 6b shows a signal-diagram of an exemplary operation of the self-correcting modular-redundancy-memory device of FIG. 6a;

FIG. 7b shows a signal-diagram of an exemplary operation of the self-correcting modular-redundancy-memory device of FIG. 7a;

DETAILED DESCRIPTION

Figure 1A:
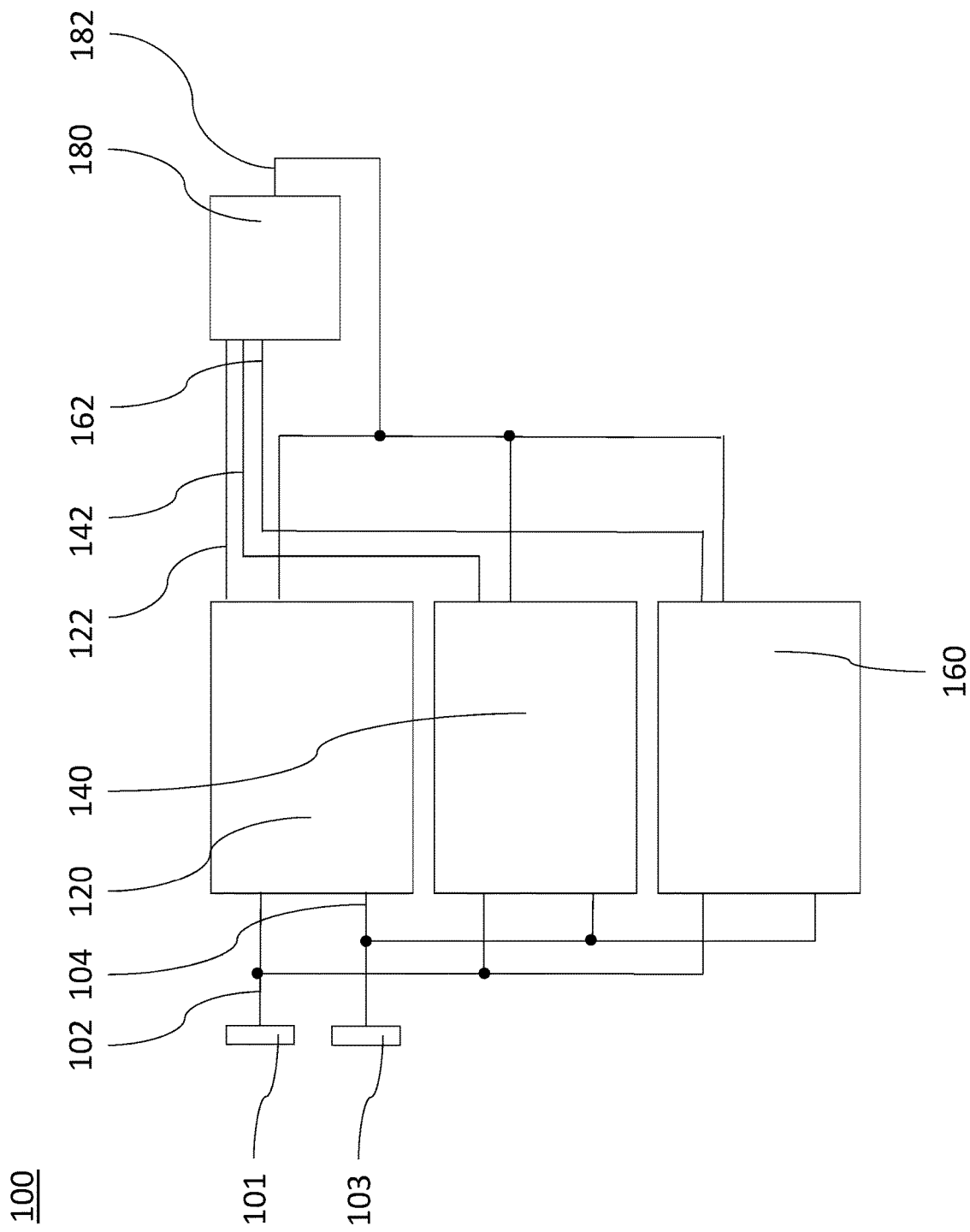
FIG. 1a shows an embodiment of a self-correcting modular-redundancy-memory device.

FIG. 1a shows an embodiment 100 of a self-correcting modular-redundancy-memory device.

The self-correcting modular-redundancy-memory device 100 comprises three bistable-memory elements 120, 140, and 160 and a majority voter 180. Furthermore, the modular-redundancy-memory device 100 comprises a data-signal terminal 101 through which it receives a binary data signal 102 and a clock-signal terminal 103 through which it receives a binary clock signal 104.

The binary data signal, the binary clock signal, and the binary feedback signal each holds one of two possible values at any moment in time. Hereinafter, those values are referred to as HIGH or "1" and LOW or "0". Moreover, the first clock-signal value is either defined as HIGH or as LOW, wherein the second clock-signal value is defined as the opposite value.

The three bistable-memory elements 120, 140, and 160 in parallel receive the binary data signal 102, the binary clock signal 104, and a feedback signal 182. Furthermore, each of the bistable-memory elements 120, 140, and 160 is configured to, in response to the binary clock signal 104 assuming a first clock signal value, provide a binary output signal 122, 142, and 162 with an output-signal value correlated to a data-signal value of the data signal 102. Moreover, each of the bistable-memory elements 120, 140 and 160 is configured to, in response to the binary clock signal 104 assuming a second clock-signal value, provide the output signal 122, 142, and 162 with the output-signal value indicator of the current feedback-signal value of the feedback signal 182.

The majority voter 180 receives the output signal 122, 142 and 162 of each of the bistable-memory elements 120, 140, and 160. Moreover, the majority voter 180 is configured to provide the feedback signal 182 with the feedback-signal value indicative of that output-signal value taken on by a majority of the currently received output signals 122, 142 and 162.

In the embodiment 100 of the modular-redundancy-memory device of FIG. 1a, the three bistable-memory elements 120, 140, 160 receive the data signal and the clock signal in parallel. In other embodiments, the modular-redundancy-memory device comprises three data-signal terminals and three clock-signal terminals for receiving a separate clock signal and a separate data signal for each of the bistable-memory elements. Moreover, in other embodiments each bistable-memory element additional receives a SET and/or a RESET-signal. An embodiment that shows both of these characteristics will be described in the following with reference to FIG. 1b.

Figure 1B:
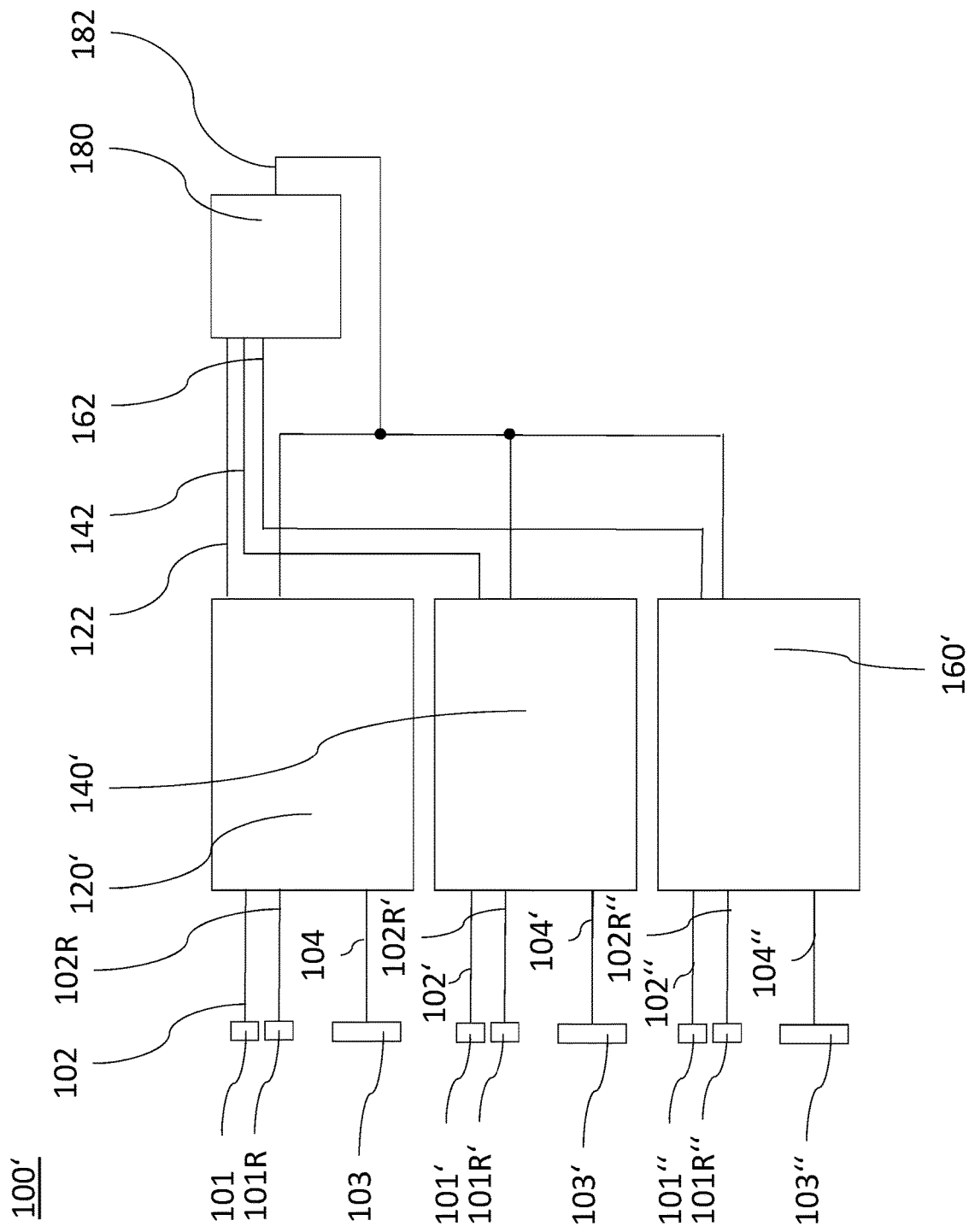
FIG. 1b shows an alternative embodiment of a self-correcting modular-redundancy-memory device, wherein each bistable-memory element additionally receives a RESET-signal.

FIG. 1b shows an embodiment 100' of a self-correcting modular-redundancy-memory device, wherein each bistable-memory element 120, 140, and 160 additionally receives a RESET-signal.

Features of the modular-redundancy-memory device 100' that are identical to those of the modular-redundancy-memory device 100 are labeled using the same reference signs. For an explanation of those features, the reader is referred to the description of FIG. 1a. In the following, only those features that are unique to the modular-redundancy-memory device 200 will be described.

The self-correcting modular-redundancy-memory device 100' comprises three bistable-memory elements 120', 140', and 160', which are implemented as D-latches receiving an additional RESET-signal, which will be explained in the following for the bistable-memory element 120'.

The bistable-memory element 120' receives the data signal 102 and the clock-signal 104 via the input terminal 101 and the clock-signal terminal 103, respectively. Furthermore, the bistable-memory element 120' receives an asynchronous RESET-signal 102R via a RESET-terminal 101R. The bistable-memory element 120' is configured to, if indicated by the RESET-signal 102R, provide the output signal 122 with the output-signal value equal to LOW independently of the data-signal value of the data signal 102 and the clock-signal value of the clock signal 104.

In other embodiments of the modular-redundancy memory device of FIG. 1b not shown here, the three bistable-memory elements additionally or alternatively an asynchronous SET-signal and the bistable-memory element 120' is configured to, if indicated by a SET-signal value of the SET-signal, provide the binary output signal 122 with the output-signal value equal to HIGH independently of the data-signal value of the data signal 102 and the clock-signal value of the clock signal 104. In yet other embodiment of the self-correcting modular-redundancy memory device of FIG. 1b, the bistable-memory elements receive both, the SET-signal and the RESET-signal.

The separate data signals 102, 102', and 102" as well as the separate clock signals 104, 104', and 104" in most use-cases of the self-correcting modular-redundancy-memory device resemble the same common data signal and clock signal, respectively. However, in principle those signals can also be of different origin.

In another embodiment of the modular-redundancy-memory device, the feedback signal 182 is also provided externally for further processing. Such an embodiment will be described in the following with reference to FIG. 2.

Figure 2:
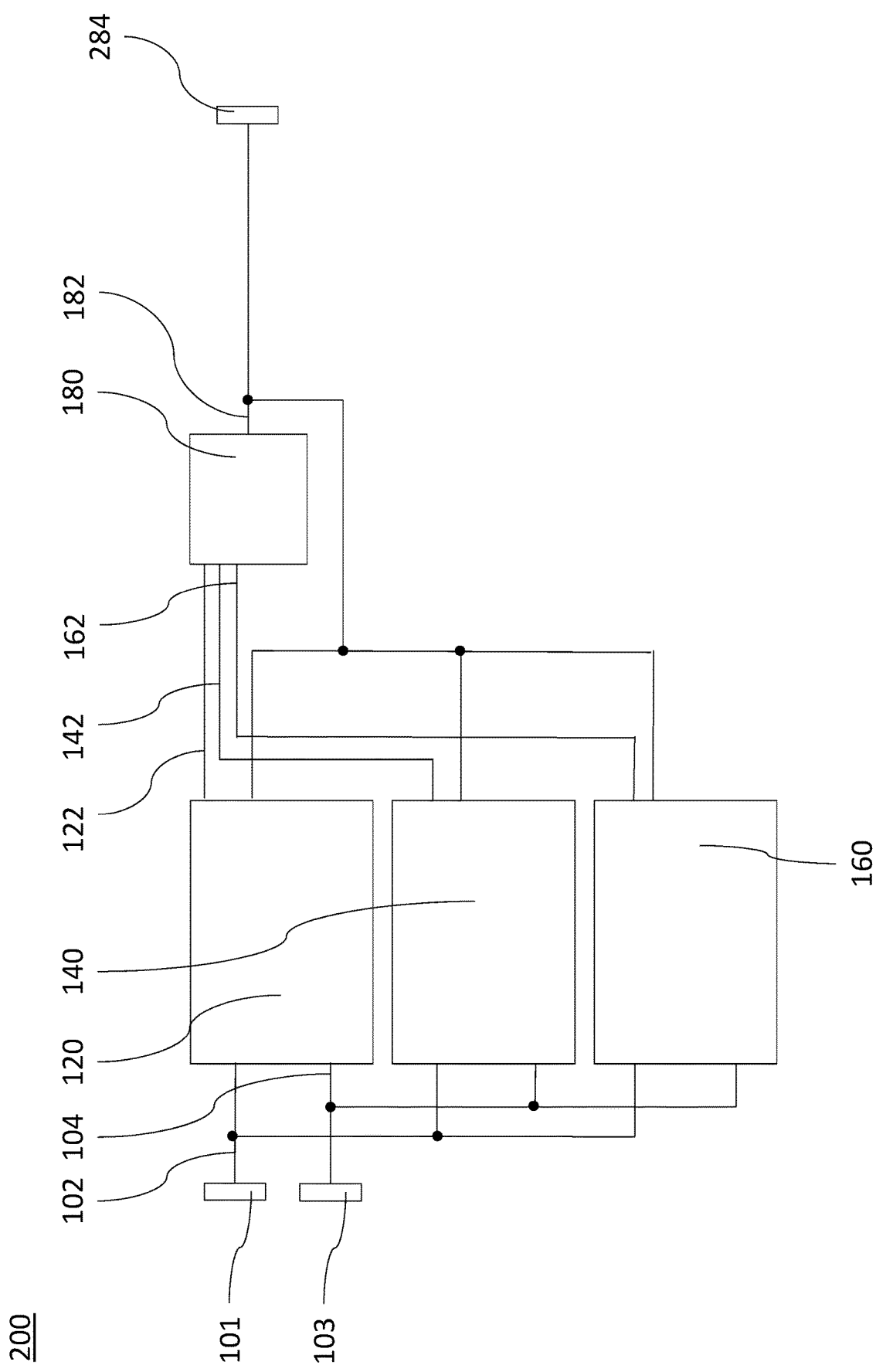
FIG. 2 shows an embodiment of a self-correcting modular-redundancy-memory device configured to externally provide the feedback signal.

FIG. 2 shows an embodiment 200 of a self-correcting modular-redundancy-memory device configured to externally provide the feedback signal 182.

Features of the modular-redundancy-memory device 200 that are identical to those of the modular-redundancy-memory device 100 are labeled using the same reference signs. For an explanation of those features, the reader is referred to the description of FIG. 1a. In the following, only those features that are unique to the modular-redundancy-memory device 200 will be described.

In comparison to the modular-redundancy-memory device 100, the modular-redundancy-memory device 200 additionally comprises a feedback-signal terminal 284 through which the feedback signal 182 provided by the majority voter 180 is provided externally. By providing the feedback signal 182 externally and not the output signals of the individual bistable-memory devices 120, 140, and 160, always that output-signal value held by the majority of the bistable-memory devices 120, 140, and 160 is provided.

Figure 3A:
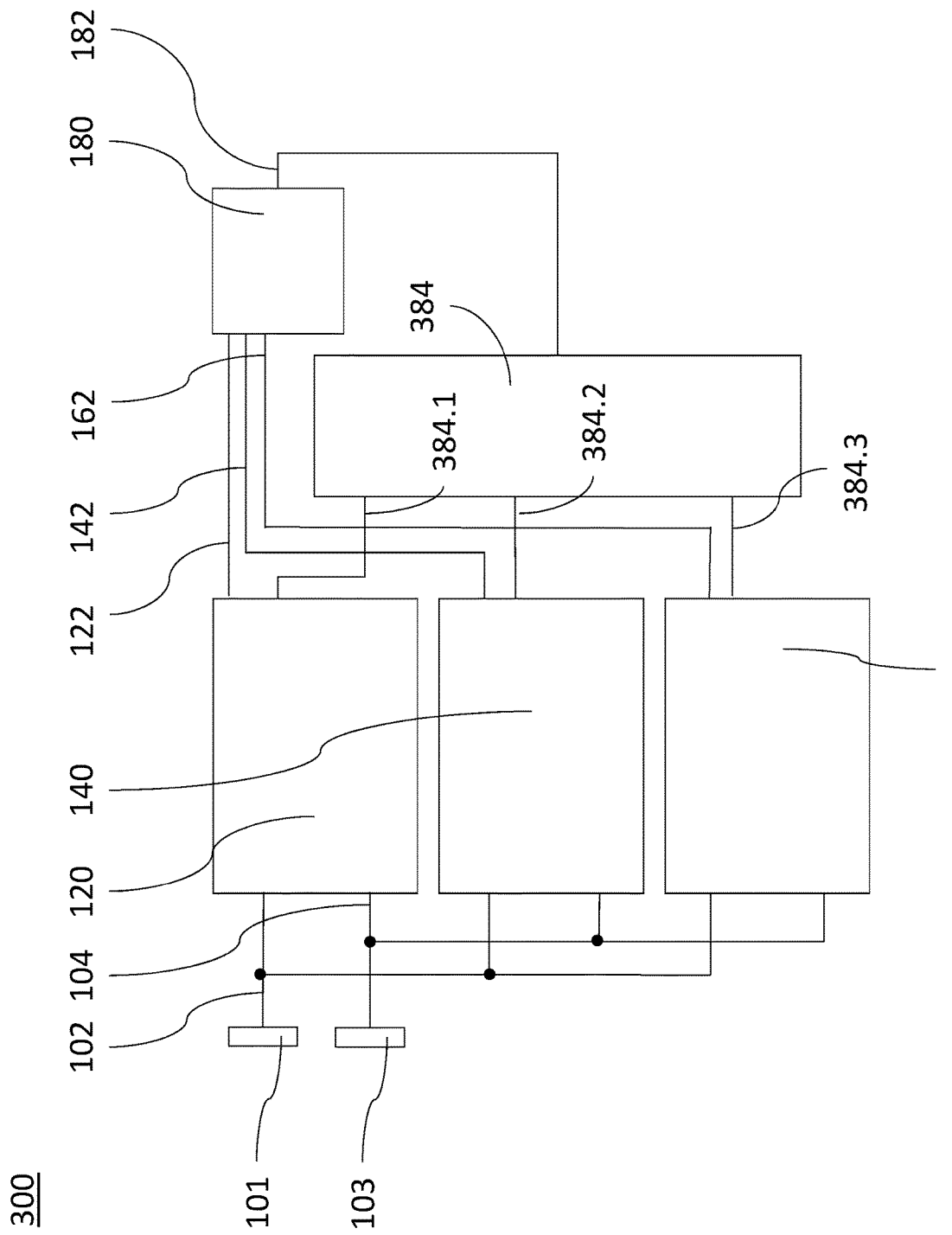
FIG. 3a shows an embodiment of the self-correcting modular-redundancy-memory device comprising a feedback-SET-filter unit.

In FIG. 2, the feedback-signal provided at the feedback-signal terminal 284 corresponds to the feedback signal as probed in a vicinity of the majority voter 180. In other embodiments of the modular-redundancy-memory device, the feedback-signal provided at the feedback-signal terminal 284 corresponds to the feedback signal as probed in a vicinity of one of the bistable-memory elements 120, 140, 160. The latter variant is particularly advantageous, if the self-correcting modular-redundancy-memory device additionally comprises a SET-filter unit, as shown in FIG. 3a. In this case, possible erroneous fluctuations of the feedback signal provided at the feedback-signal terminal 284 are minimized because the provided signal corresponds to a signal within the feedback path immediately before the feedback loop is closed.

In other embodiments of the modular-redundancy-memory device, additionally or alternatively an inverted feedback signal is provided via the feedback-signal terminal 284.

The number of redundant bistable-memory elements of the self-correcting modular-redundancy-memory device 100 is three. As a result the self-correcting modular-redundancy-memory device 100 is also often referred to as self-correcting triple-modular-redundancy (TMR) memory device. Nevertheless, other embodiments of the modular-redundancy-memory device also comprise an odd number of bistable-memory elements greater than three.

The redundancy of the bistable-memory elements 120, 140, and 160 as well as the self-correction of the bistable-memory elements 120, 140, and 160 through the majority voter 180 protects the modular-redundancy-memory device 100 against loss of information due to single event upsets (SEUs) caused by a particle directly hitting of one of the bistable-memory elements 120, 140, or 160. However, loss of information can also be caused by single event transients (SETs), which are voltage pulses or glitches generated as a result of an ionization event. Loss of information due to SETs can be prevented by introducing a single-event-transient filter unit. In the following, different embodiments of the modular-redundancy-memory device comprising a single-event-transient filter unit will be described with reference to FIGS. 3a-6.

FIG. 3a shows an embodiment 300 of the self-correcting modular-redundancy-memory device comprising a feedback-SET-filter unit 384 for filtering the feedback signal.

Again, features of the modular-redundancy-memory device 300 that are identical to those of the modular-redundancy-memory device 100 are labelled using the same reference signs. For an explanation of those features the reader is referred to the description of FIG. 1a. In the following, only those features that are unique to the modular-redundancy-memory device 300 will be described.

In comparison to the modular-redundancy-memory device 100, the modular-redundancy-memory device 300 additional comprises the feedback-SET-filter unit 384. The feedback-SET-filter unit 384 receives the feedback signal 182 provided by the majority voter 180 and is configured to performed a filtering operation to filter alterations due to SETs from the feedback signal 182 and provided a filtered feedback signal 384.1, 384.2, and 384.3 to the bistable-memory elements 120, 140, and 160, respectively.

Different embodiment of single-event-transient filter units are already known in the prior art, such as, for example, in U.S. Pat. No. 8,975,913 B2. In the following, different exemplary embodiments of the single-event-transient filter unit known from the prior art will be described with reference to FIG. 3b.

Figure 3B:
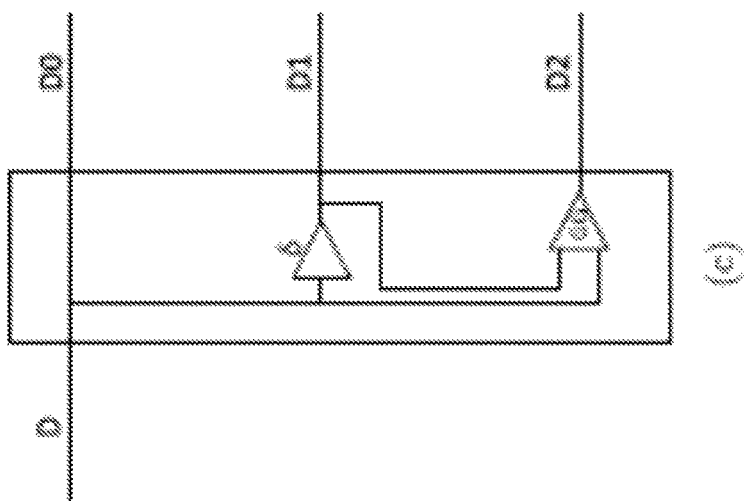
FIG. 3b shows three exemplary embodiments of the single-event-transient filter unit labelled (a), (b), and (c)
Figure 3B:
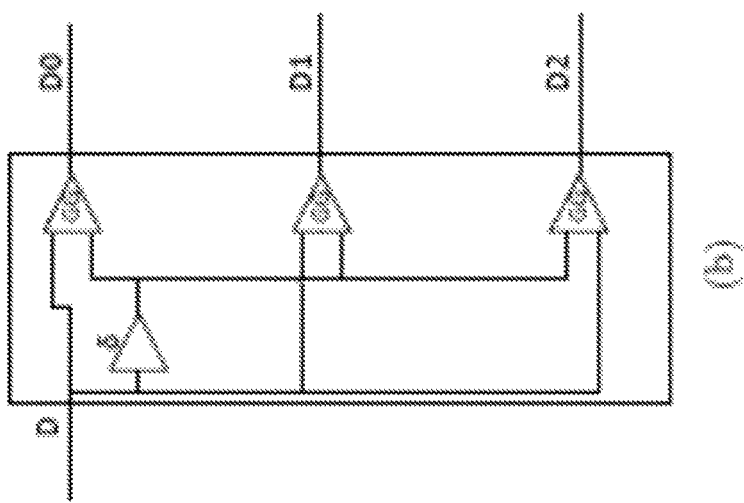
Figure 3B:
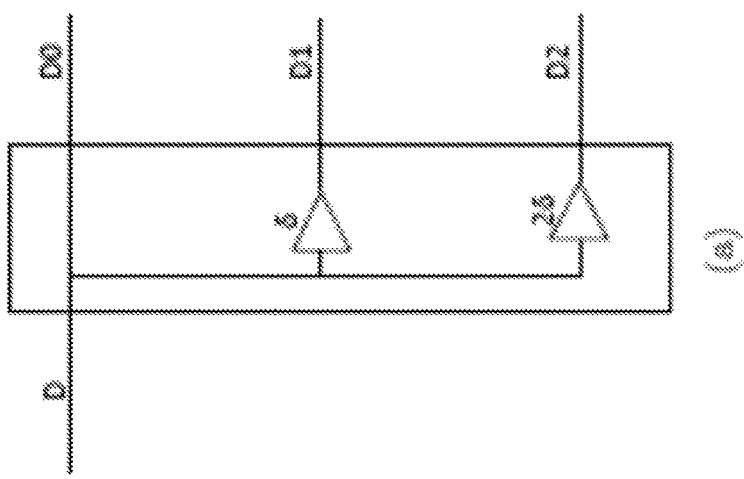

FIG. 3b shows three exemplary embodiments of the single-event-transient filter unit labelled "(a)", "(b)", and "(c)". The three exemplary embodiments of a single-event-transmission filter unit are implemented different approaches to filter alterations of the feedback signal due to SETs.

The embodiment "(a)" of the single-event-transient filter unit receives an input signal labelled "D" and is configured to dispose of any alterations caused by SETs by shifting the input signal "D" in time to shift it outside a time window during which, for example, the feedback signal is being processed by the bistable-memory elements. To this end, the embodiment "(a)" of the single-event-transient filter unit is configured to split the input signal "D" into three output signals labelled "D0", "D1", and "D2", wherein the output signal "D1" corresponds to the input signal "D" delayed by a time span "δ" and the output signal "D2" corresponds to the input signal "D" delayed by a time span 2-times "δ".

An alternative approach is implemented by the embodiment "(b)" of the single-event-transient filter unit, which comprises three guard gates labelled "GG". The guard gates "GG" each receive the input signal "D" as a first input and the input signal "D" delayed by a time span "δ" as a second input. The guard gates are configured to only externally provide an output signal, labelled "D0", "D1", and "D2", respectively, if the signal received at their two inputs is identical. As a result, alterations of the signal introduced by a SET shorter than a time span "δ" are filtered from the input signal "D".

In the embodiment "(c)", the single-event-transient filter unit receives an input signal labeled "D" and is configured to provide three output signals labeled "D0", "D1", and "D2". The output signal "D0" directly corresponds to the input signal "D", while the output signal "D1" corresponds to a delayed version of the input signal "D" delayed by a time span "δ". The output signal "D2" corresponds to an output provided by a guard gate which receives, as a first input, the input signal "D" and, as a second input, the input signal "D" delayed by the time span "δ".

The three embodiments shown in FIG. 3b are to be understood as non-limiting examples of a single-event-transient filter unit. It is also possible to use other embodiments of the single-event-transient filter with the modular-redundancy-memory device.

Besides introducing a single-event-transient filter unit for filtering the feedback signal 182, it is also possible to introduce a single-event-transient filter unit for filtering the data signal 102 before it is received by the bistable-memory elements 120, 140, and 160 as will be explained in the following with reference to FIG. 4.

Figure 4:
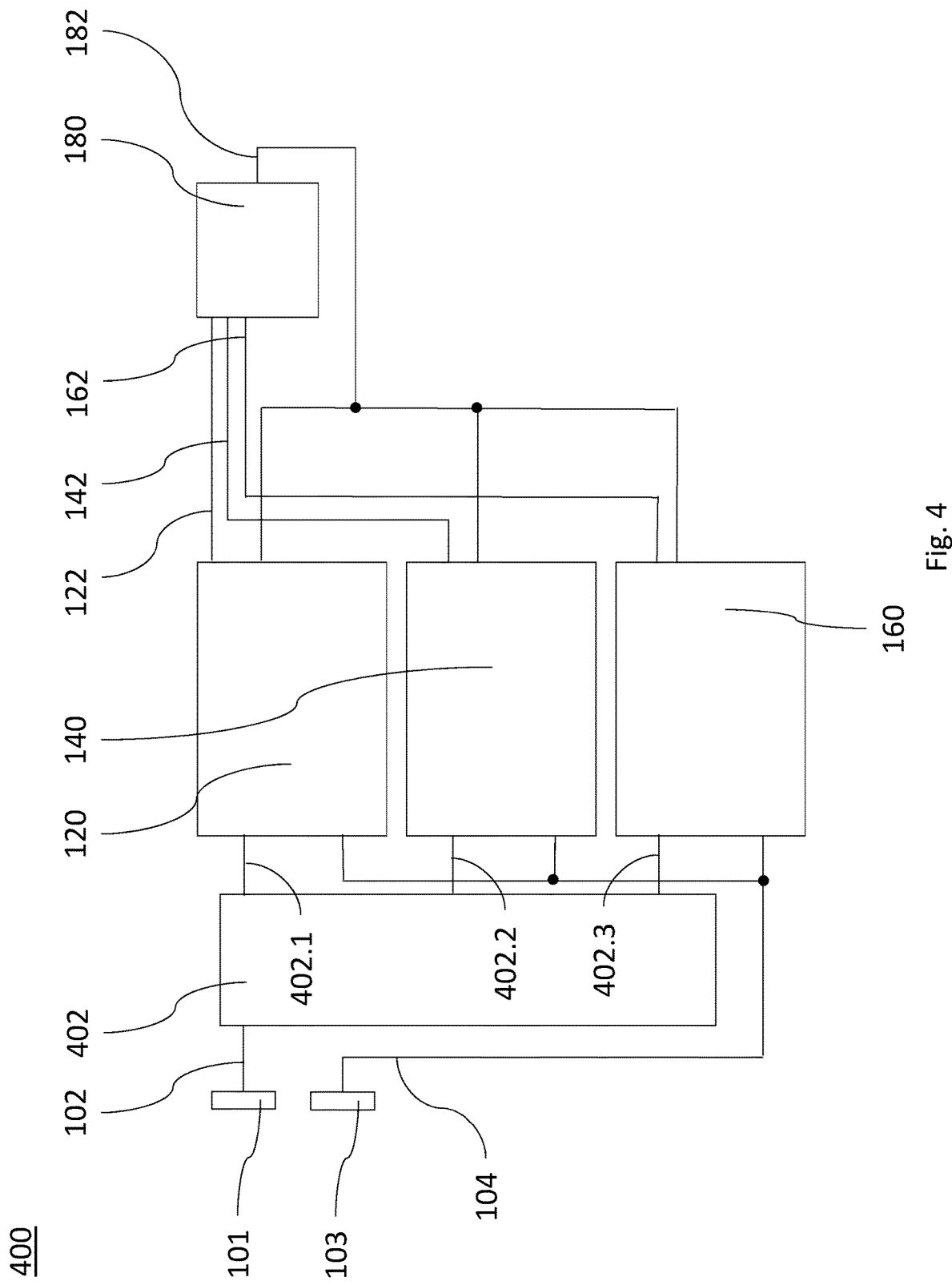
FIG. 4 shows an embodiment of the self-correcting modular-redundancy-memory device comprising a data-SET-filter unit for filtering the data signal.

FIG. 4 shows an embodiment 400 of the self-correcting modular-redundancy-memory device comprising a data-SET-filter unit 402 for filtering the data signal 102.

Again, features of the modular-redundancy-memory device 400 that are identical to those of the modular-redundancy-memory device 100 are labelled using the same reference signs. For an explanation of those features the reader is referred to the description of FIG. 1a. In the following, only those features that are unique to the modular-redundancy-memory device 400 will be described.

The modular-redundancy-memory device 400 additionally comprises the data-SET-filter unit 402. The data-SET-filter unit 402 receives the data signal 102 and is configured to provide filtered data signals 402.1, 402.2, and 402.3, which correspond to the received data signal 102 filtered for alterations from SETs. The filtered data signals 402.1, 402.2, and 402.3 are received by the bistable-memory elements 120, 140, and 160, respectively.

Alternatively or additionally it is possible to introduce a single-event-transient filter unit also for the clock signal 104 received by the bistable-memory elements 120, 140, and 160 to protect against SETs. Such an embodiment will be described in the following with reference to FIG. 5.

Figure 5:
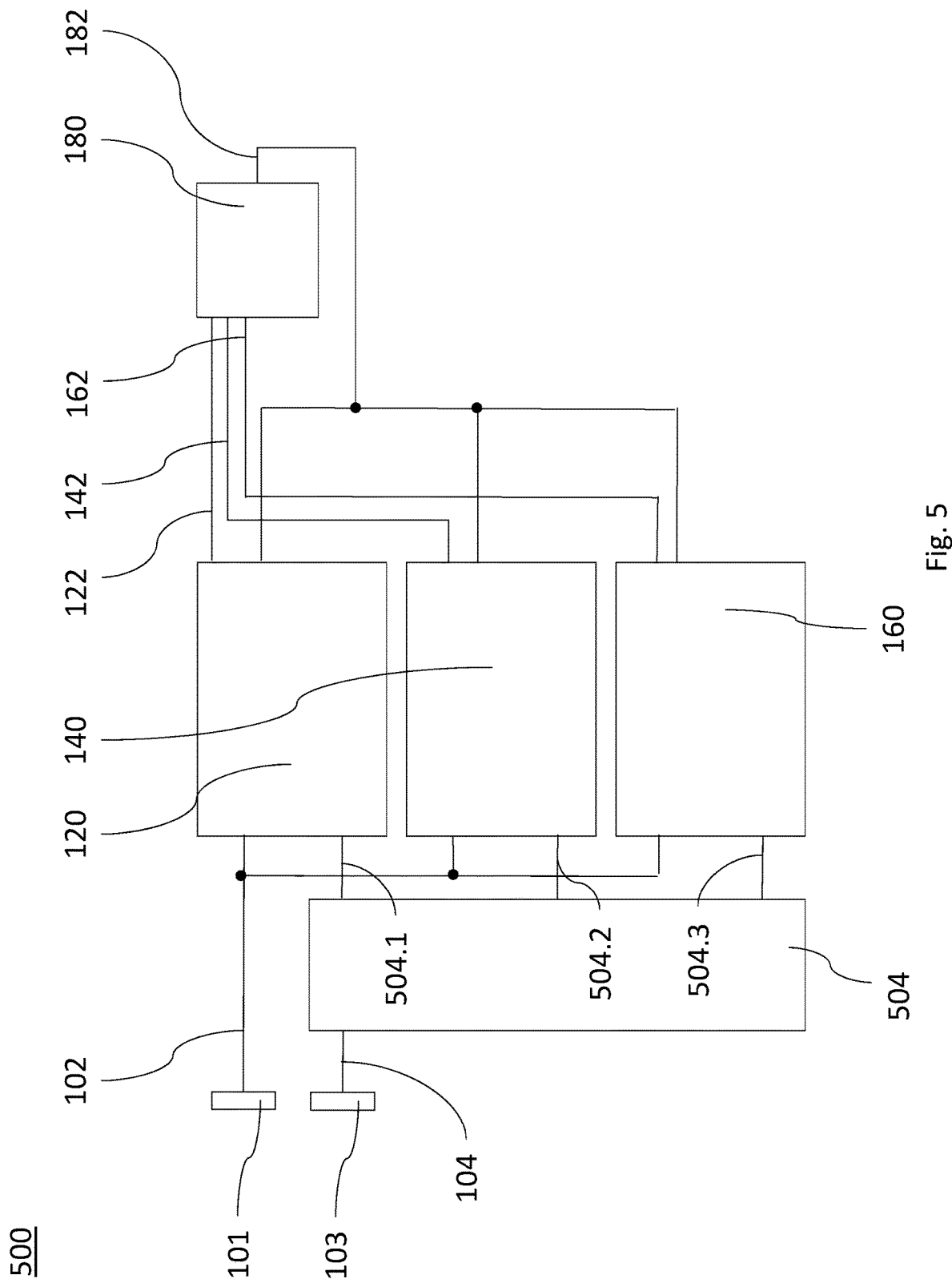
FIG. 5 shows an embodiment of the self-correcting modular-redundancy-memory device comprising a clock-SET-filter unit for filtering the clock signal.

FIG. 5 shows an embodiment 500 of the self-correcting modular-redundancy-memory device comprising a clock-SET-filter unit 504 for filtering the clock signal 104.

Again, features of the modular-redundancy-memory device 500 that are identical to those of the modular-redundancy-memory device 100 are labelled using the same reference signs. For an explanation of those features the reader is referred to the description of FIG. 1a. In the following, only those features that are unique to the modular-redundancy-memory device 500 will be described.

The embodiments 500 of the self-correcting modular-redundancy-memory device additionally comprises the clock-SET-filter unit 504. The clock-SET-filter unit 504 receives the clock signal 104 and is configured to provide a filtered clock signal 504.1, 504.2 and 504.3, which correspond to the received clock signal 104 filtered for alterations from SETs. The filtered clock signals 504.1, 504.2, and 504.3 are received by the stable-memory elements 120, 140, and 160, respectively.

In the embodiments of the self-correcting modular-redundancy-memory device described above, bistable-memory elements can either be implemented as a latch or a flip-flop. In the following, a bistable-memory element implemented as an edged-triggered flip-flop and a bistable-memory element implemented as a level-triggered latch will be described with reference to FIGS. 6a and 6b and to FIGS. 7a and 7*b* respectively. Afterwards, a bistable-memory element implemented as a rising-edge TSPC flip-flop is described with reference to FIG. 11.

Figure 6A:
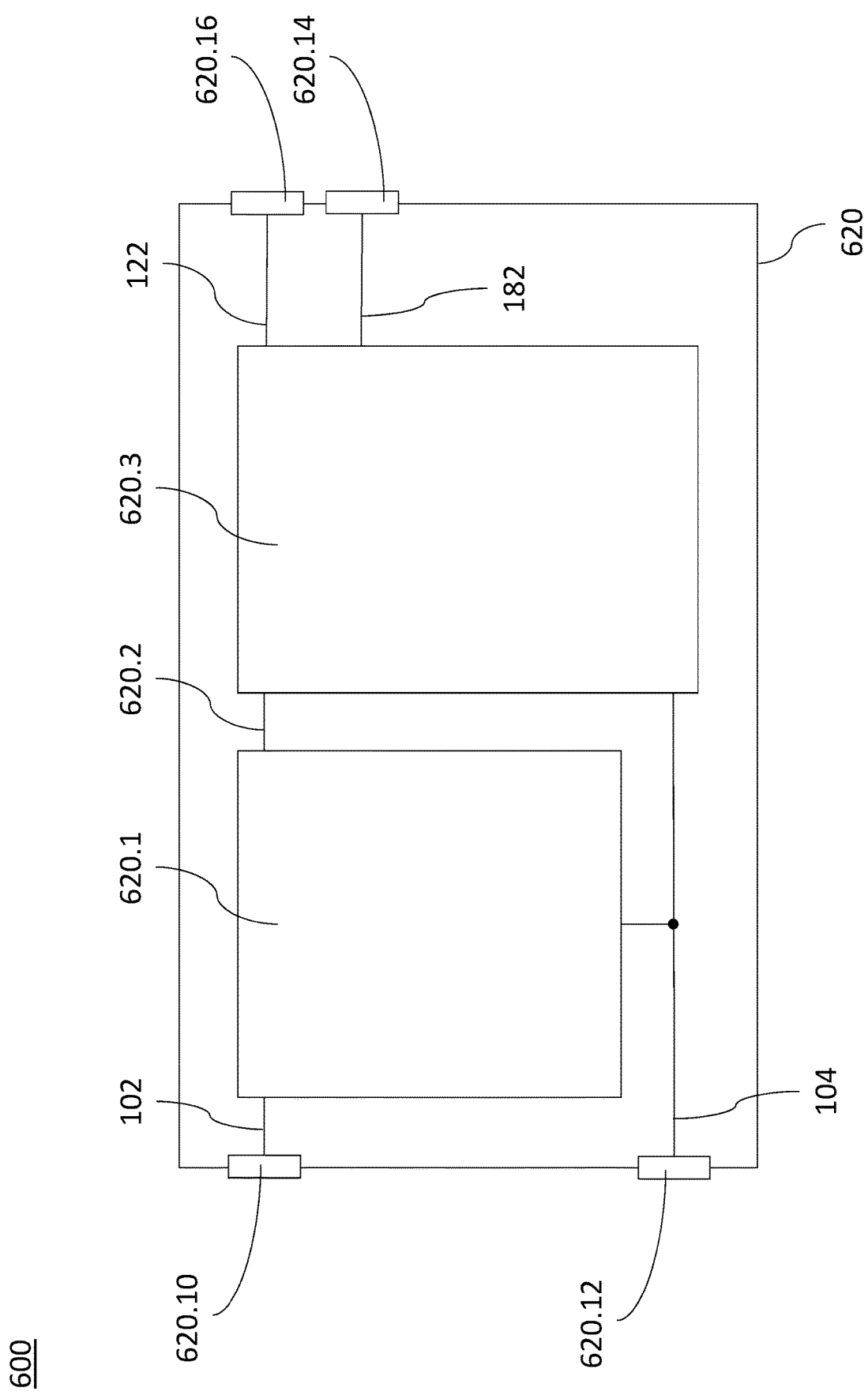
FIG. 6a shows an exemplary bistable memory element of an embodiment of a self-correcting modular-redundancy-memory device, which is implemented as a flip-flop.

FIG. 6*a* shows a bistable memory elements 620 of a self-correcting modular-redundancy-memory device 600, which is implemented as a flip-flop.

The bistable-memory element 620 receives the data signal 102 via a data-signal terminal 620.10, the clock signal 104 via a clock-signal terminal 620.12, and the feedback signal 182 from the majority voter 180 via a feedback-signal terminal 620.14.

The flip-flop is realized in the bistable-memory device 620 by a series arrangement of a latch 620.1 and an open-latch 620.3. The latch 620.1 receives both the data signal 102 and the clock signal 104 and is configured to in response to the binary clock signal 104 assuming the second clock-signal value, provide an intermediate-output signal 620.2 with an intermediate-output-signal value indicative of the current data-signal value of the data signal 102, and in response to the binary clock signal 104 assuming the first clock-signal value, provide the intermediate-output signal 620.2 with the intermediate-output-signal value indicative of that data-signal value assumed by the data signal 102 when the clock signal 104 last assumed the second clock-signal value.

The open-latch 620.3 receives the intermediate-output signal 620.2, the clock signal 104, and the feedback signal 182 and is configured to in response to the binary clock signal (104, "CLK") assuming the first clock-signal value ("CLK1"), provide the output signal (122, 142, 162, "O1") with the output-signal value indicative of the current intermediate-output-signal value ("C IO1") of the intermediate-output signal (620.2, "IO1"), and in response to the binary clock signal (104, "CLK") assuming the second clock-signal value ("CLK2"), provide the output signal (122, 142, 162, "O1") with the output-signal value indicative of the current feedback-signal value ("C F") of the feed-back signal (182, "F").

The feedback path of the open-latch 620.3 is closed by providing the output signal 122 via an output-signal terminal 620.16 to the majority voter (not shown in FIG. 6*a*, see 180 in FIG. 1*a*) and receiving the feedback signal 182 provided by the majority voter as an input to the open-latch 620.3.

FIG. 6*b* shows a signal diagram of an exemplary operation of the self-correcting modular-redundancy-memory device of FIG. 6*a* comprising three copies of the bistable-memory elements 620. All three copies receive the clock signal "CLK" and the feedback signal "F" as shown in FIG. 6*b*. Moreover, the first bistable-memory element receives the data signal "D1" as shown in FIG. 6*b*, while the second and third bistable-memory elements receive the data signal "D2" and "D3", which differ from the data signal "D1" only in the glitch "G", which sets the data signal "D1" to HIGH, while the data signal "D2" and data signal "D3" remain LOW. Moreover, in the example of FIG. 6*b*, the first clock-signal value corresponds to HIGH, while the second clock-signal value corresponds to LOW.

The latch 620.1 of the first bistable-element receives both the data signal "D1" and the clock signal "CLK". In response to the binary clock signal "CLK" assuming the second clock-signal value LOW, the latch 620.1 is configured to provide an intermediate-output signal "IO1" with an intermediate-output-signal value "CD1" indicative of the current data-signal value of the data signal "D1". In this particular example, the values "C D1" correspond to the values of "D1" when "CLK" is LOW.

Further, in response to the binary clock signal "CLK" assuming the first clock-signal value HIGH, the latch 620.1 is configured provide the intermediate-output signal "IO1" with the intermediate-output-signal value "L D1" of that data-signal value assumed by the data signal "D1" when the clock signal "CLK" last assumed the second clock-signal "LOW". In this particular example, the values "L D1" correspond to the values of "D1" when "CLK" transitions from LOW to HIGH. Assuming that the first transition from LOW to HIGH of "D1" is due to a SET and only affected "D1", so that D2 and D3 are still indicative of the intended value of the input binary data signal, the value of "L D1", that is directly associated to the glitch "G" in "D1", is an erroneous intermediate output signal.

The open-latch 620.3 of the first bistable-memory element receives the intermediate-output signal "IO1", the clock signal "CLK", and the feedback signal "F". While the binary clock signal "CLK" assumes the first clock-signal value HIGH, the open-latch 620.3 is configured to provide the output signal "O1" with the output-signal value indicative of the current intermediate-output-signal value "C IO1" of the intermediate-output signal "IO1". Thus, while the clock assumes a HIGH value, the output signal corresponds to the value that the input signal had during the last transition of "CLK" from LOW to HIGH. In the example shown in FIG. 6*b*, the second value of "C IO1" is directly associated with the erroneous value of "LD1" due to the SET in "D1". However, the output from the majority voter F is driven by the two input signals "D2" and "D3" that have not been affected by the SET.

Therefore, while the binary clock signal "CLK" assumes the second clock-signal value, LOW in this particular example, the open-latch 620.3 is configured to, provide the output signal "O1" with the output-signal value indicative of the current feedback-signal value "C F" of the feed-back signal "F", thereby correcting the erroneous output of "O1".

Figure 7A:
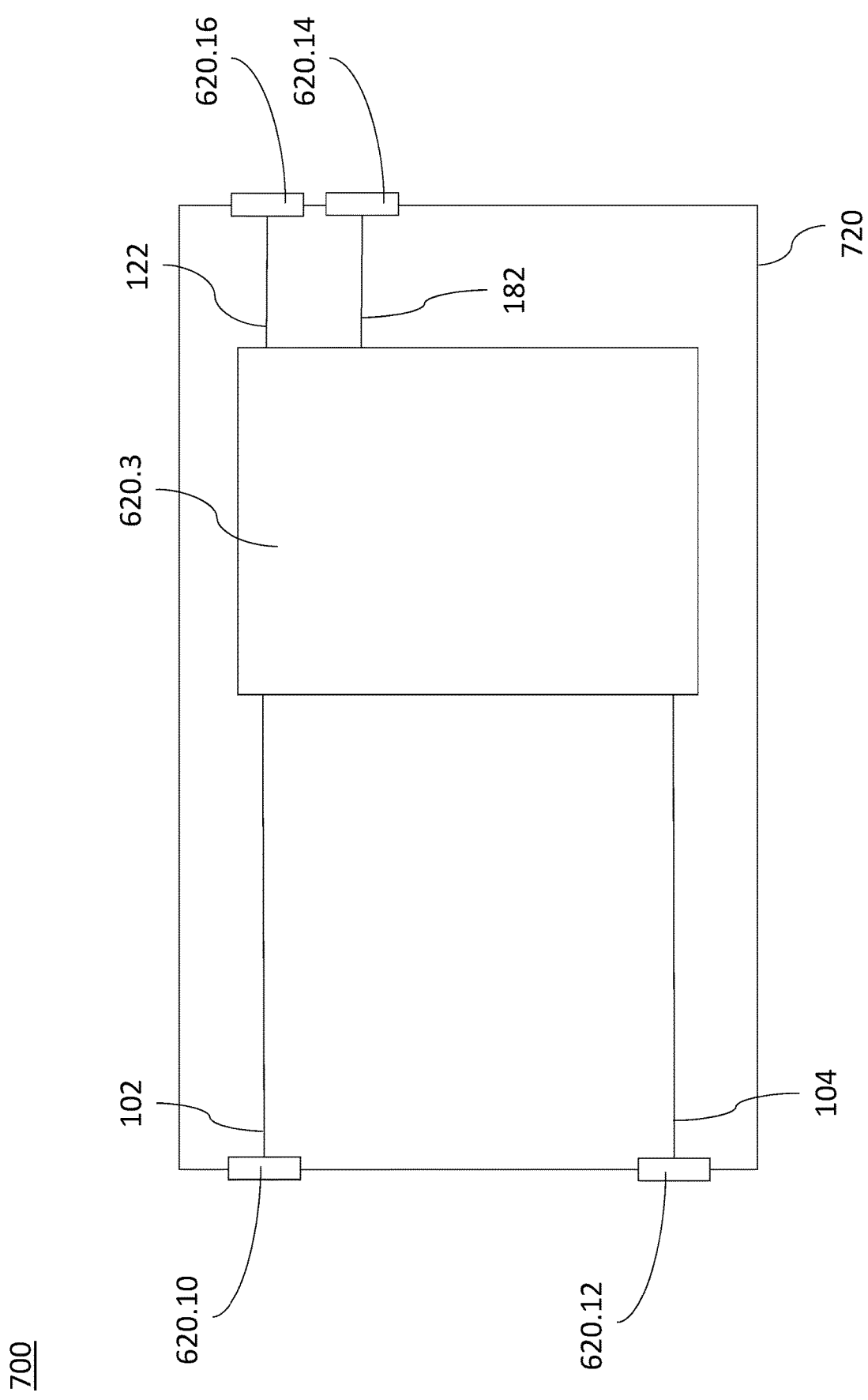
FIG. 7a shows an exemplary bistable memory element of an embodiment of a self-correcting modular-redundancy-memory device, which is implemented as an open latch.

FIG. 7*a* shows an exemplary bistable-memory element 720 of an embodiment of a self-correcting modular-redundancy-memory device 700, which is implemented as an open latch.

The bistable-memory element 720 comprises an open-latch 620.3 that receives the data signal 102 via a data-signal terminal 620.10, the clock signal 104 via a clock-signal terminal 620.12, and the feedback signal 182 via a feedback-signal terminal 620.14. In response to the binary clock signal 104 assuming the first clock-signal value, the open-latch 620.3 is configured to provide the output signal 122 with the output-signal value indicative of the current data-signal value of the data signal 102. In response to the binary clock signal 104 assuming the second clock-signal value the open-latch is configured to provide the output signal 122 with the output-signal value indicative of the current feedback-signal value of the feedback signal 182.

Figure 7B:
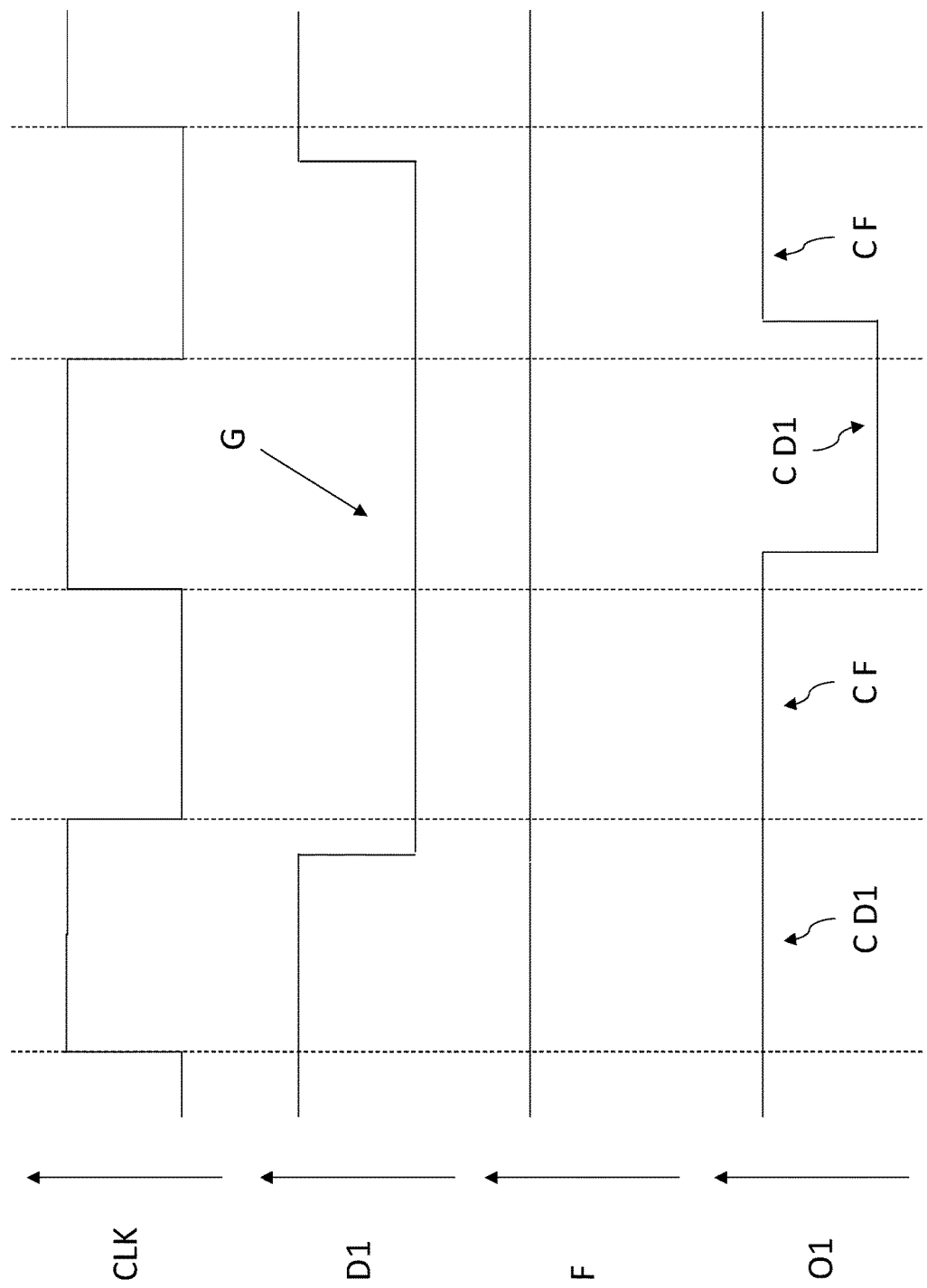

FIG. 7*b* shows a signal diagram of an exemplary operation of the self-correcting modular-redundancy-memory device 700 of FIG. 7*a* comprising three copies of the bistable-memory elements 720, wherein the open latch 620.3 is implemented as a positive level triggered latch.

Each of the bistable-memory elements receives a clock signal "CLK" and a feedback signal "F". Moreover, a first bistable-memory element receives a data signal "D1", shown in FIG. 7*b*, while the other two bistable-memory elements receive a data signal "D2" and a data signal "D3", respectively. The data signal "D1" is identical to the data signal "D2" and the data signal "D3" except for a glitch labeled "G" in FIG. 7b. Due to the glitch "G", the data signal "D1" remains LOW when the clock signal "CLK" assumes HIGH for a second time, while the data signal "D2" and "D3" assume a HIGH level.

While the clock signal "CLK" assumes a HIGH level, the output signal "O1" corresponds to the current value of "D1", referred to as "C D1". While the clock signal "CLK" assumes a LOW, the output signal "O1" corresponds to the current value of the feedback signal "F", referred to as "CF", that is provided by the majority voter. In the time diagram of FIG. 7b, "D1" remains LOW during the second HIGH clock phase, which causes "O1" to assume a LOW level during that clock phase (taking into account intrinsic time delays due to the logical circuitry) due to the glitch. However, while "D1" remains low, "D2" and D3 assume HIGH. Thus, the output of the majority voter, "F", is HIGH and the erroneous output value "O1" of LOW is corrected in the subsequent LOW clock phase.

Figure 8:
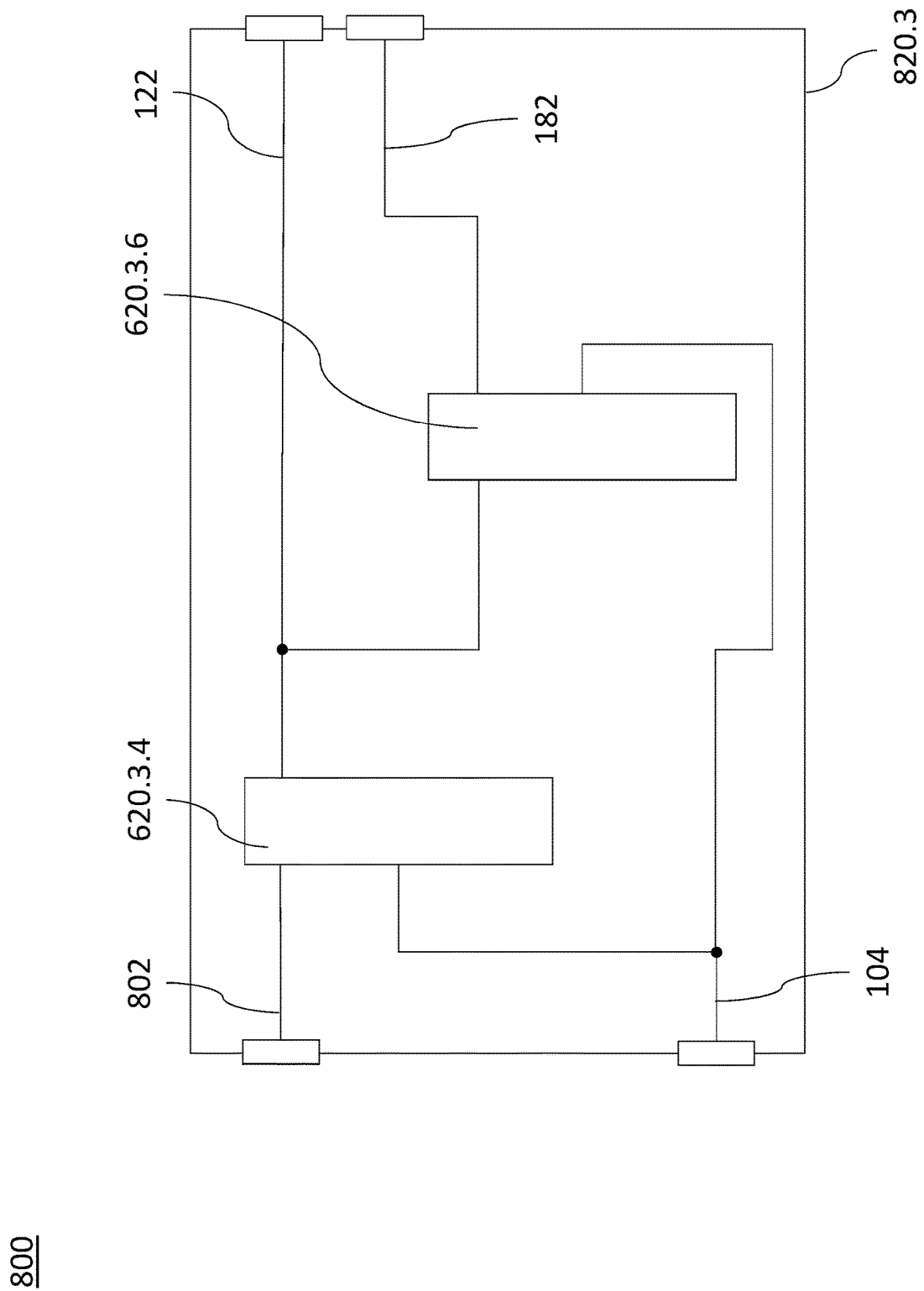
FIG. 8 shows an exemplary bistable memory element of another embodiment of a self-correcting modular-redundancy-memory device.

FIG. 8 shows an exemplary bistable-memory element 820.3 of another embodiment of a self-correcting modular-redundancy-memory device 800. The open-latch 820.3 comprises a data-forwarding circuit 620.3.4 that is configured to receive the clock signal 104. The data-forwarding circuit 620.3.4 is further configured to receive a logical signal 802, which is the data signal in the particular case where the bistable-memory element is an open latch, or, alternatively, the intermediate-output signal 620.2 in the particular case where the bistable-memory element is a flip-flop.

In response to the binary clock signal 104 assuming the first clock-signal value, the data-forwarding circuit 620.3.4 is configured to provide the output signal 122 with the output-signal value indicative of a current logic-signal value of the logic signal 802, i.e. either the data signal or the intermediate output signal, to the majority voter (not show in FIG. 8, see 180 of FIG. 1a). Further, in response to the binary clock signal 104 assuming the second clock-signal value, the data-forwarding circuit 620.3.4 is configured to prevent the provision of the output signal 122.

In the device 800, the open-latches 820.3 optionally also comprises a feedback-forwarding circuit 620.3.6 that receives the feedback signal 182 and the clock signal 104. In response to the binary clock signal 104 assuming the second clock-signal value, the feedback-forwarding circuit 620.3.6 is configured to provide the output signal 122 with the output-signal value indicative of the current feedback-signal value of the feedback signal 182 to the majority voter (not shown in FIG. 8, see 180 in FIG. 1a). Further, in response to the binary clock signal 104 assuming the first clock-signal value, the feedback-forwarding circuit 620.3.6 is configured prevent the provision of the output signal 122.

Figure 9:
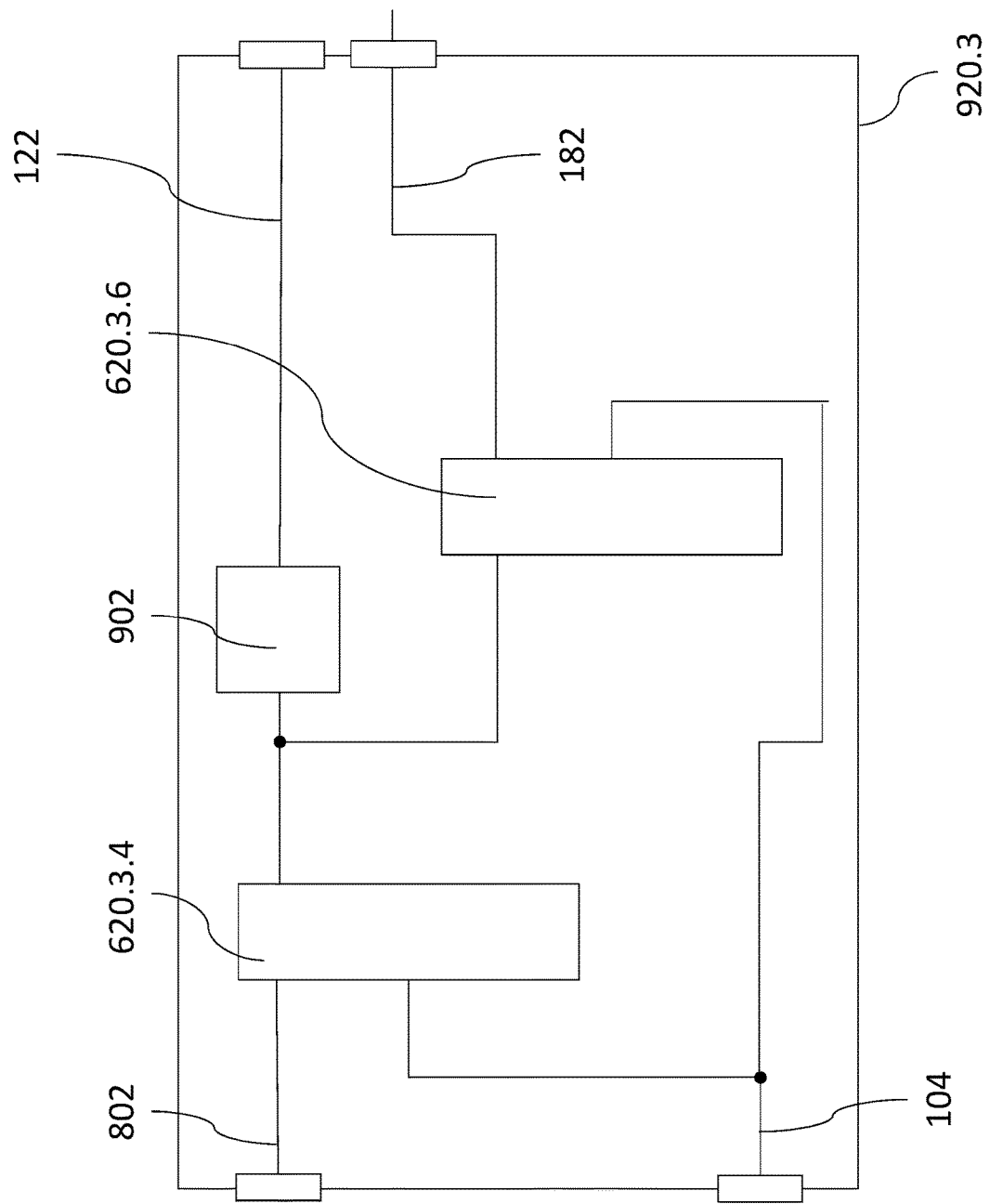
FIG. 9 shows an exemplary bistable memory element of another embodiment of a self-correcting modular-redundancy-memory device.
Figure 10A:
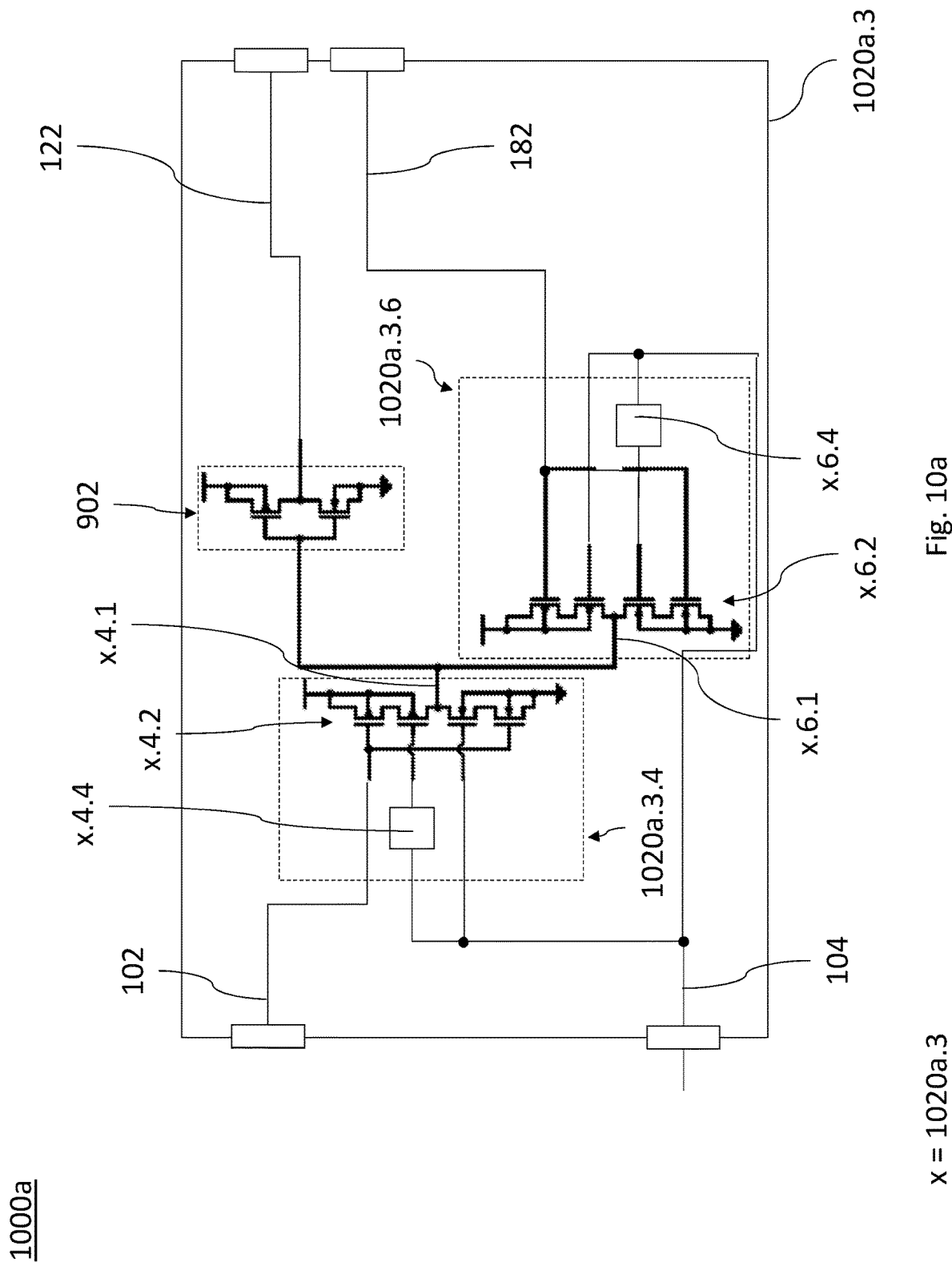
FIG. 10a shows a circuit diagram of an exemplary bistable memory element of another embodiment of a self-correcting modular-redundancy-memory device.
Figure 10B:
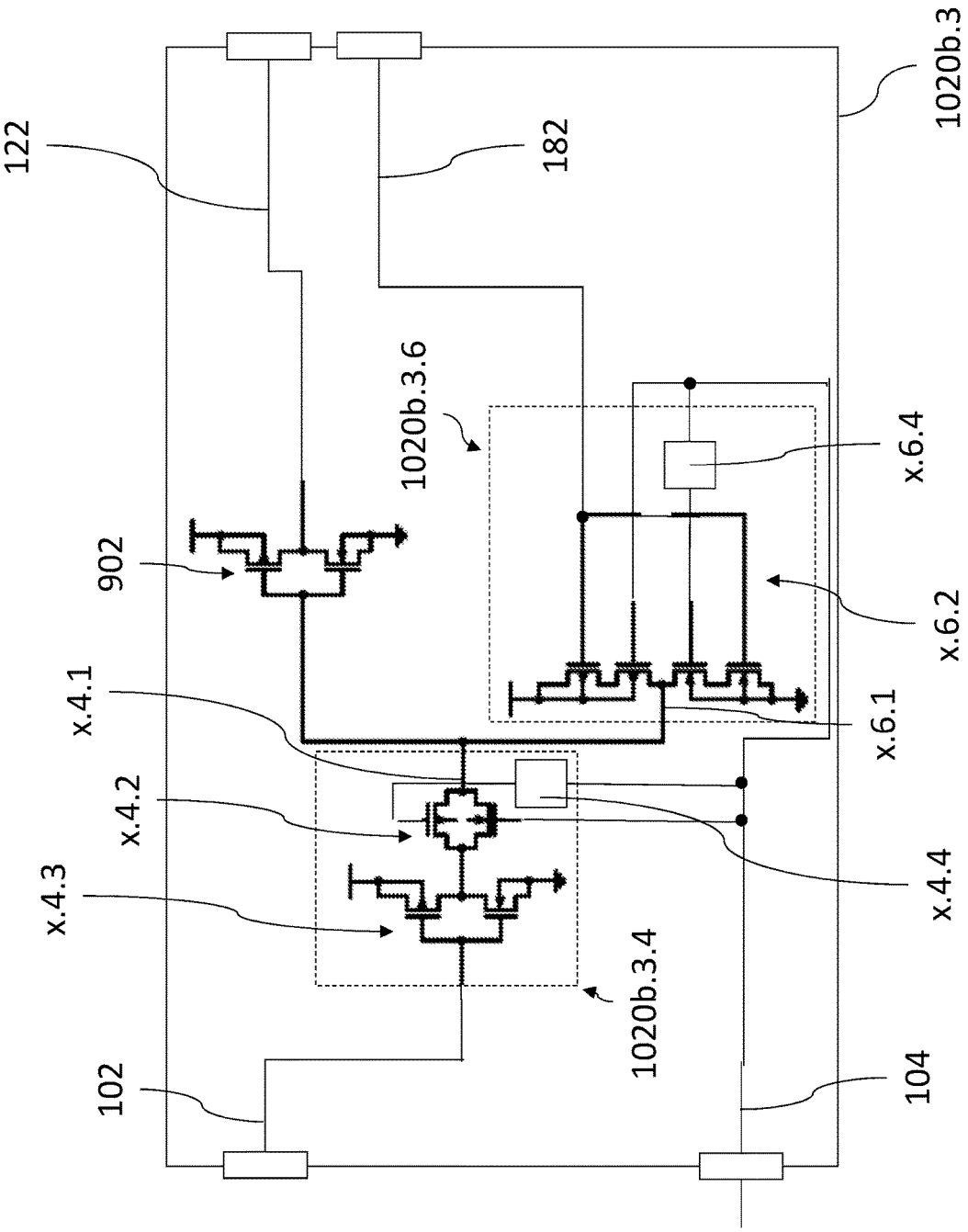
FIG. 10b shows a circuit diagram of an exemplary bistable memory element of another embodiment of a self-correcting modular-redundancy-memory device.
Figure 10C:
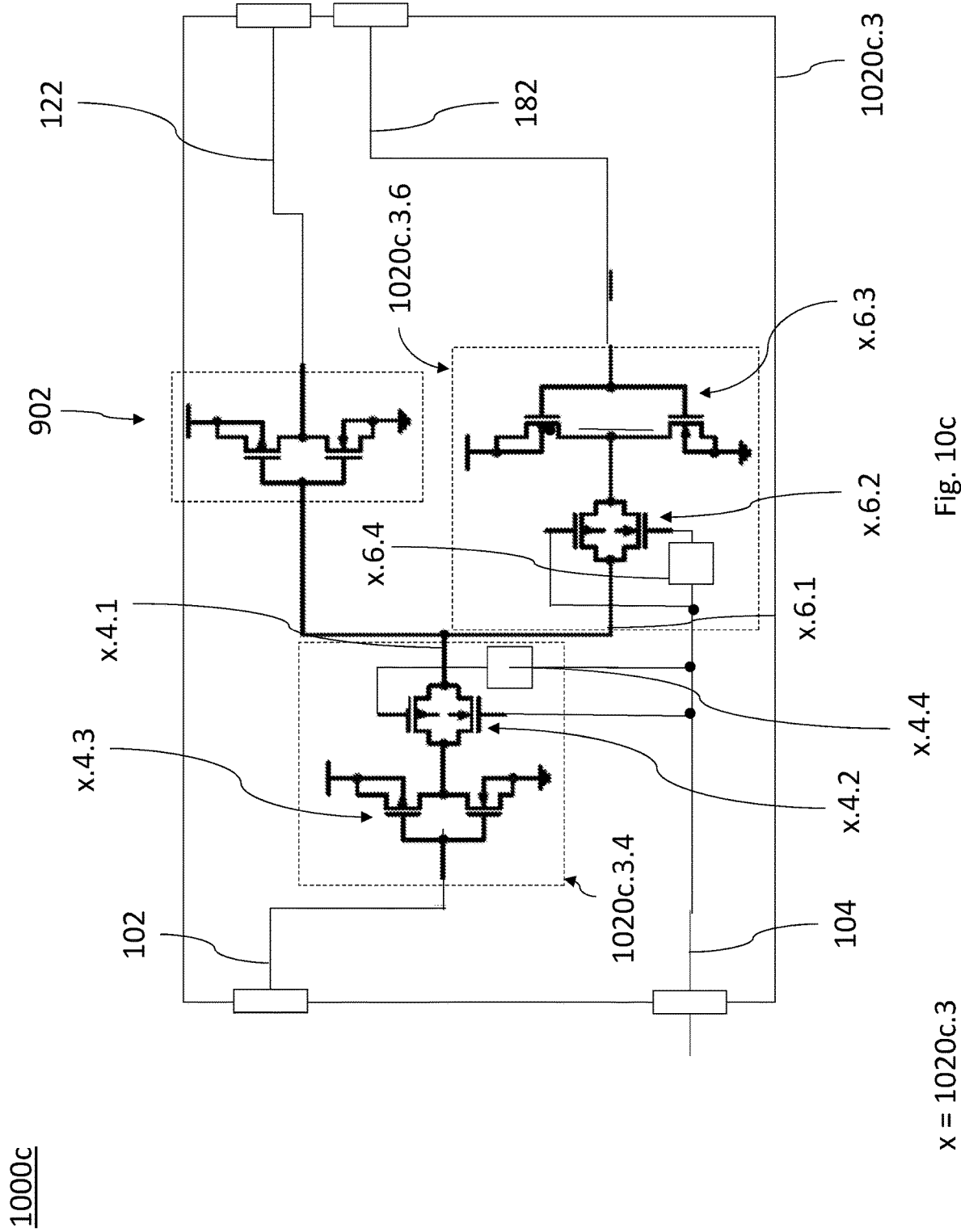
FIG. 10c shows a circuit diagram of an exemplary bistable memory element of yet another embodiment of a self-correcting modular-redundancy-memory device.

FIG. 9 shows an exemplary bistable memory element of another embodiment of a self-correcting modular-redundancy-memory device. The open-latch 920.3 is similar to the open latch 820.3 of FIG. 8a and further comprises an inverting stage 902, arranged so that the output signal has the complementary binary value of the output of the data-forwarding circuit 620.3.4. when the binary clock signal assumes the first clock-signal value and the complementary binary value of the output of the feedback-forwarding circuit 620.3.6. when the binary clock signal assumes the second clock-signal value FIGS. 10a, 10b, and 10c show respective circuit diagrams of exemplary data-forwarding circuits and feedback-forwarding circuits. In FIG. 10a, the open latch 1020a.3 comprises a data-forwarding circuit 1020a.3.4 that includes a tristate inverter 1020a.3.4.2. In this particular example, the tristate inverter comprises 2 pMOS transistors together controlling a connection of an output node 1020a.3.4.1 of the tristate inverter to a first voltage supply line Vcc associated to a HIGH binary value. It also comprises 2 nMOS transistors together controlling a connection of the output node 1020a.3.4.1 of the tristate inverter to a second voltage supply line GND that is associated to a LOW binary value. The binary data signal 102 is provided to the gates of an nMOS and an pMOS transistor. The other nMOS transistor receives at its gate the clock signal and the remaining pMOS transistor receives at its gate a complementary clock signal that is obtained by providing the clock signal to an inverter stage 1020.a.3.4.4. In this particular arrangement, the MOS transistors connected to the clock signal and to the inverted clock signal conduct whenever the clock signal is HIGH, i.e. when the inverse clock signal is LOW. In this case, when the input data signal 102 is LOW or 0, both pMOS transistors conduct and the output node is electrically connected to Vcc, thereby providing a HIGH binary value at the output node. Conversely, when the data signal is HIGH or 1, both nMOS transistors conduct and the output node is electrically connected to GND, thus providing a LOW binary value at the output node. On the other hand, when the clock signal is LOW, and the inverse clock signal is HIGH, neither of the MOS transistors receiving the clock signal and its inverse conduct, and the output node is not connected to VCC or to GND via the tristate inverter 1020a.3.4.2.

In another exemplary circuit, the polarity of the MOS transistors is inverted and, additionally or alternatively the inverse of the clock signal is not provided to the pMOS transistor but to the nMOS transistor.

Since the binary value at the output node of the tristate inverter 1020a.3.4.2 while the clock signal assumes a HIGH value is the inverse of the data signal, an inverting stage 902 is included to provide, as output signal, a value corresponding to the data signal.

Additionally, the open latch 1020a.3 comprises a feedback-forwarding circuit 1020a.3.6 that also comprises a tristate inverter 1020a.3.6.2. whose output node 1020a.3.6.1. is connected to the output node 1020.a.3.4.1 of the tristate inverter 1020.a.3.4.2. The operation is similar to that discussed with reference to the tristate inverter 1020.a.3.4.2. However, the connection of the clock signal and the inverse clock signal obtained by providing the clock signal 104 to an inverting stage 1020a.3.6.4 is such that the output is provided at an opposite clock phase as in the case of the data-forwarding circuit 1020a.3.4. In this example, the binary value at the output node 1020a.3.4.1 is the inverse of the feedback signal whenever the clock signal is LOW (and thus the inverse clock signal is HIGH). Therefore, during a HIGH clock phase the output signal 122 corresponds to the (inverse of the inverse of the) binary data signal and during a LOW clock phase the output signal corresponds to the (inverse of the inverse of the) feedback signal 182.

In FIG. 10b, the data-forwarding circuit 1020b.3.4 comprises a combination of a C-element 1020b.3.4.3 for providing the inverse of the binary data signal and a transmission gate 1020b.3.4.2, for controlling the provision of the inverse of the binary data signal only during a predetermined clock phase. For example, in transmission gate 1020b.3.4.2, the nMOS transistor receives at its gate the clock signal, which is also provided via an inverting stage 1020b3.4.4 to the pMOS transistors. Thus, the inverse of the binary data signal is provided to the output node of the data-forwarding circuit 1020b.3.4 only when the clock signal is HIGH.

Additionally, or alternatively, the feedback-forwarding circuit may also comprise a combination of a C-element and a transmission gate, as it is shown in FIG. 10c. In FIG. 10c. the feedback-forwarding circuit 1020c.3.6 comprises a combination of a C-element 1020c.3.6.3 for providing the inverse of the feedback signal 182 and a transmission gate 1020b.3.6.2, for controlling the provision of the inverse of the binary data signal only during a predetermined clock phase, different to the phase where the data-forwarding circuit 1020c.3.4 provides the output. In FIG. 10c, the data-forwarding circuit 1020c.3.4 is analogous to that of FIG. 10b and provides the complementary binary value of binary data signal when the clock signal is in a HIGH phase. Further, the data-forwarding circuit 1020c.3.6 provides the complementary value of the feedback signal 182 when the clock signal is in a LOW phase.

The bistable-memory elements shown in FIGS. 6a-10c are based on common CMOS technology. However, it is also possible to implement the bistable-memory elements using other dynamic approaches, such as the TSPC logic, which will be described with reference to FIG. 11a and FIG. 11b in the following.

Figure 11A:
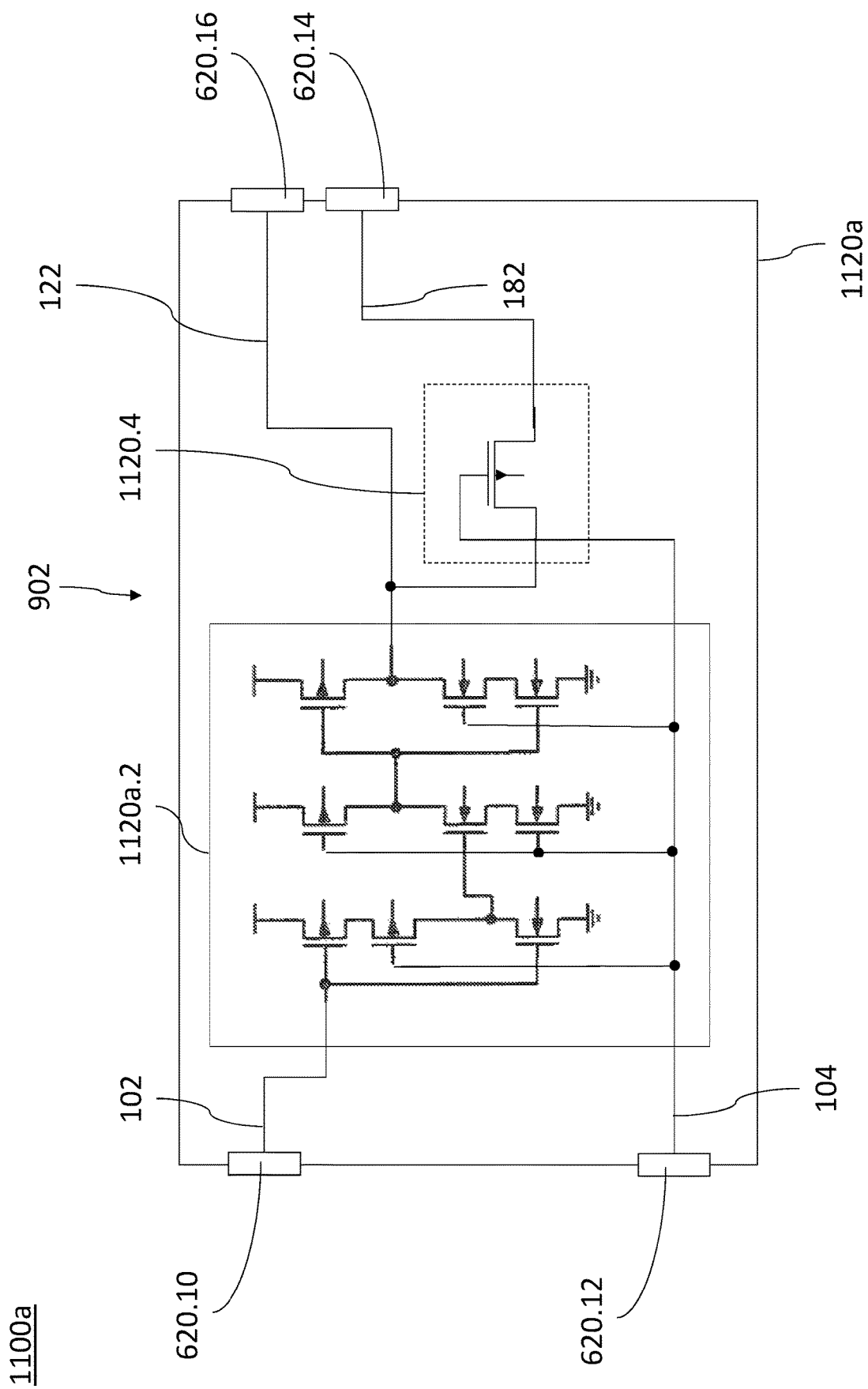
FIG. 11a shows an alternative embodiment of a bistable-memory element comprised within a self-correcting modular-redundancy-memory device.

FIG. 11a shows an alternative embodiment of a bistable-memory element 1120a comprised within a self-correcting modular-redundancy-memory device 1100a.

The bistable-memory element 1120a comprises a rising-edge TSPC flip-flop 1120a.2 with three gated inverters, which receives the data signal 102 via the data-signal terminal 620.10 and the clock signal 104 via the clock-signal terminal 620.12, wherein an output terminal of the flip-flop 1120a.2 is connected to the output terminal 620.16.

Furthermore, the bistable-memory element 1120a comprises a TSPC transmission gate 1120.4, which receives the feedback signal 182 via the feedback-signal terminal 620.14 and the clock signal 104 and is configured to provide at its output terminal the feedback signal 182, when the value of the clock signal 104 is LOW. Moreover, the output terminal of the transmission gate 1120.4 is also connected to the output terminal 620.16.

Other variations to the disclosed embodiments can be understood and effected by those skilled in the art in practicing the claimed invention, from a study of the drawings, the disclosure, and the appended claims.

In other embodiments, the bistable-memory element also comprises other implementations of the TSCP flop-flop. An example of such an embodiment will be explained with reference to FIG. 11b in the following.

Figure 11B:
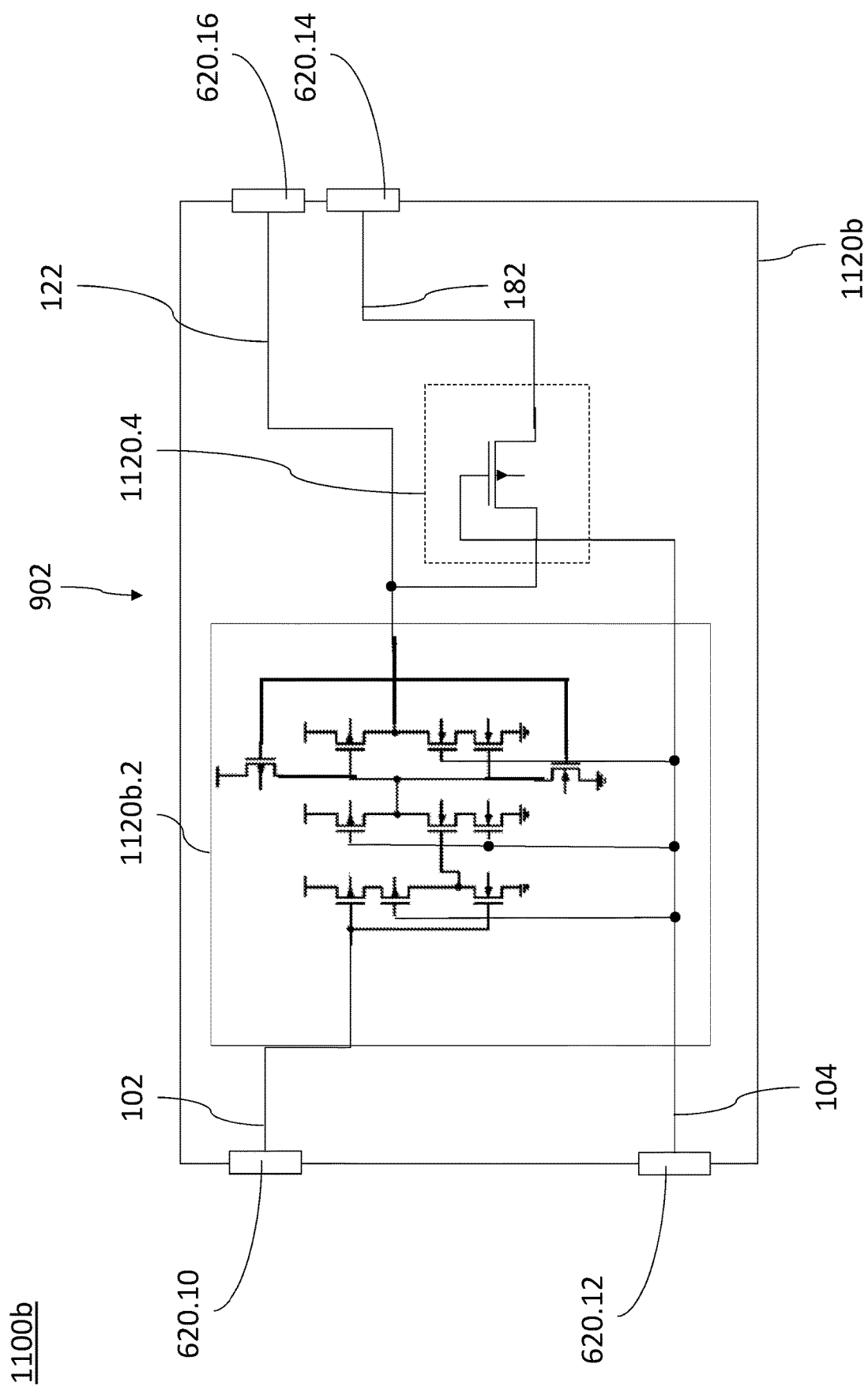
FIG. 11b shows yet another alternative embodiment of a bistable-memory element comprised within a self-correcting modular-redundancy-memory device.

FIG. 11b shows yet another alternative embodiment of a bistable-memory element 1120b comprised within a self-correcting modular-redundancy-memory device 1100b.

All elements of the bistable-memory element 1120a that are also comprised within the bistable-memory element 1120b are labelled in FIG. 11b using the same reference signs as used in FIG. 11a. Those elements will not be explained again. Instead, the following description of FIG. 11b mainly focuses on the description of those elements of the bistable-memory element 1120b that differ from those of bistable-memory element 1120a.

Similar to the bistable-memory element 1120a, the bistable-memory element 1120b comprises a rising-edge TSCP flip-flop 1120b.2 with three gated inverters. However, in addition to the three gated inverter, the gated inverter closest to the output of the flip-flip comprises an additional feedback loop to stabilize internal nodes.

In summary, the invention is directed to a self-correcting modular-redundancy-memory device, comprising three bistable-memory elements and a majority voter. The bistable-memory elements receive respective binary data signal, clock signal, and a feedback signal. Each of the bistable-memory elements is configured, in response to the clock signal assuming a first value, to provide a binary output signal with an output-signal value correlated to a data-signal value of the data signal, and in response to the clock signal assuming a second clock-signal value, to provide the output signal with the output-signal value indicative of a current feedback-signal value of the feedback signal. The majority voter receives the output signals each of the bistable-memory elements and is configured to provide the feedback signal with the feedback-signal value indicative of that output-signal value taken on by a majority of the currently received output signals.

In the claims, the word "comprising" does not exclude other elements or steps, and the indefinite article "a" or "an" does not exclude a plurality.

A single unit, stage or device may fulfil the functions of several items recited in the claims. The mere fact that certain measures are recited in mutually different dependent claims does not indicate that a combination of these measures cannot be used to advantage.

Any reference signs in the claims should not be construed as limiting the scope.

What is claimed is:

1. A self-correcting modular-redundancy-memory device, comprising
an odd number of at least three bistable-memory elements and a majority voter, wherein
the bistable-memory elements each receive a respective binary signal, a respective binary clock signal, and a respective binary feedback signal and wherein each of the bistable-memory elements is configured to
in response to the binary clock signal assuming a first clock-signal value, provide a binary output signal with an output-signal value correlated to a data-signal value of the data signal, and
in response to the binary clock signal assuming a second clock-signal value, provide the output signal with the output-signal value indicative of a current feedback-signal value of the feedback signal; and wherein
the majority voter receives the output signal of each of the bistable-memory elements and is configured to provide the feedback signal with the feedback-signal value indicative of that output-signal value taken on by a majority of the currently received output signals.

2. The device of claim 1, further comprising a feedback-SET-filter unit that receives, as a filter-input signal, the feedback signal and is configured to provide, as a filter-output signal, to at least one of the bistable-memory elements a filtered feedback signal, which corresponds to the received feedback signal from which at least a part of signal disturbances caused by single-event transients is removed.

3. The device of claim 1, further comprising a data-SET-filter unit that receives, as a filter-input signal, one data signal and is configured to provide, as a filter-output signal, to at least one of the bistable-memory elements a filtered data signal, which corresponds to the received data signal from which at least a part of signal disturbances caused by single-event transients is removed.

4. The device of claim 1, further comprising a clock-SET-filter unit that receives, as a filter-input signal, the clock signal and is configured to provide, as a filter-output signal, to at least one of the bistable-memory elements a filtered clock signal, which corresponds to the received clock signal from which at least a part of signal disturbances caused by single-event transients is removed.

5. The device of claim 2, wherein the feedback-SET-filter unit or a data-SET-filter unit or a clock-SET-filter unit comprise
- at least one delay unit which receives the filter-input signal and is configured to provide, as the filtered-output signal, the filter-input signal delayed by a predetermined time-span, or
- at least one guard gate that receives the filter-input signal and a delayed filter-input signal, which is the filter-input signal delayed by a predetermined time span, and is configured to provide, as the filter-output signal, a signal indicative of the filter-input signal only if the filter-input signal and the delayed filter-input signal are indicative of the same value.

6. The device according to claim 1, wherein each of the bistable-memory elements is configured to
- in response to the binary clock signal assuming the first clock-signal value, provide the binary output signal with the output-signal value indicative of that data-signal value assumed by the data signal during a last preceding transition of the clock-signal value from the second clock-signal value to the first clock-signal value.

7. The device according to claim 6, wherein each of the bistable-memory elements comprises
- a latch that receives the data signal and the clock signal and is configured to
- in response to the binary clock signal assuming the second clock-signal value, provide an intermediate-output signal with an intermediate-output-signal value indicative of the current data-signal value of the data signal, and
- in response to the binary clock signal assuming the first clock-signal value, provide the intermediate-output signal with the intermediate-output-signal value indicative of that data-signal value assumed by the data signal when the clock signal last assumed the second clock-signal value; and
- an open-latch that receives the intermediate-output signal, the feedback signal, and the clock signal and is configured to
- in response to the binary clock signal assuming the first clock-signal value, provide the output signal with the output-signal value indicative of the current intermediate-output-signal value of the intermediate-output signal, and
- in response to the binary clock signal assuming the second clock-signal value, provide the output signal with the output-signal value indicative of the current feedback-signal value of the feed-back signal.

8. The device according to claim 1, wherein each of the bistable-memory elements is configured to
- in response to the binary clock signal assuming a first clock-signal value, provide a binary output signal with an output-signal value indicative of a current data-signal value of the data signal.

9. The device according to claim 8, wherein each of the bistable-memory elements comprises an open-latch that receives the data signal, the clock signal, and the feedback signal and is configured to
- in response to the binary clock signal assuming the first clock-signal value, provide the output signal with the output-signal value indicative of the current data-signal value of the data signal, and
- in response to the binary clock signal assuming the second clock-signal value, provide the output signal with the output-signal value indicative of the current feedback-signal value of the feedback signal.

10. The device according to claim 7, wherein each of the open-latches comprises
- a data-forwarding circuit that receives the clock signal and either, the data signal or, the intermediate-output signal, both hereinafter identically referred to as logic signal, and is configured to
- in response to the binary clock signal assuming the first clock-signal value, provide the output signal with the output-signal value indicative of a current logic-signal value of the logic signal to the majority voter, and
- in response to the binary clock signal assuming the second clock-signal value, prevent the provision of the output signal by the data-forwarding circuit.

11. The device according to claim 7, wherein each of the open-latches comprises
- a feedback-forwarding circuit that receives the feedback signal and the clock signal and is configured to
- in response to the binary clock signal assuming the second clock-signal value, provide the output signal with the output-signal value indicative of the current feedback-signal value of the feedback signal to the majority voter, and
- in response to the binary clock signal assuming the first clock-signal value, prevent the provision of the output signal by the feedback-forwarding circuit.

12. The device according to claim 10, wherein the data-forwarding circuit or the feedback-forwarding circuit comprise a tristate inverter or a combination of a transmission gate and a C-element.

13. The device according to claim 1, wherein the number of bistable-memory elements is three.

* * * * *